(12) United States Patent
Puthenthermadam et al.

(10) Patent No.: US 10,529,435 B2
(45) Date of Patent: Jan. 7, 2020

(54) FAST DETECTION OF DEFECTIVE MEMORY BLOCK TO PREVENT NEIGHBOR PLANE DISTURB

(71) Applicant: SanDisk Technologies LLC, Plano, TX (US)

(72) Inventors: Sarath Puthenthermadam, San Jose, CA (US); Deepanshu Dutta, Fremont, CA (US); Long Pham, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 17 days.

(21) Appl. No.: 15/863,404

(22) Filed: Jan. 5, 2018

(65) Prior Publication Data

US 2019/0214100 A1    Jul. 11, 2019

(51) Int. Cl.
*G11C 16/34* (2006.01)
*G11C 16/10* (2006.01)
*G11C 16/32* (2006.01)
*G11C 16/04* (2006.01)

(52) U.S. Cl.
CPC ...... *G11C 16/3427* (2013.01); *G11C 16/0483* (2013.01); *G11C 16/107* (2013.01); *G11C 16/32* (2013.01); *G11C 16/3454* (2013.01)

(58) Field of Classification Search
CPC .................. G11C 16/3427; G11C 16/0483
USPC ........................................................ 365/2
See application file for complete search history.

(56) References Cited

U.S. PATENT DOCUMENTS

| 6,717,851 | B2 | 4/2004 | Mangan et al. |
| 8,830,745 | B2 | 9/2014 | Mui et al. |
| 9,703,719 | B2 | 7/2017 | Balakrishnan et al. |
| 9,792,995 | B1 | 10/2017 | Shah et al. |
| 2009/0150601 | A1* | 6/2009 | Conley ............... G06F 12/0246 711/103 |
| 2010/0321977 | A1* | 12/2010 | Sekar ....................... G11C 7/00 365/148 |
| 2012/0321032 | A1 | 12/2012 | Liu et al. |
| 2016/0019948 | A1* | 1/2016 | Pang ................... G11C 11/5628 365/185.03 |
| 2017/0125117 | A1 | 5/2017 | Tseng et al. |

* cited by examiner

*Primary Examiner* — Huan Hoang
*Assistant Examiner* — Muna A Techane
(74) *Attorney, Agent, or Firm* — Vierra Magen Marcus LLP

(57) ABSTRACT

A bad block of memory cells is quickly detected and removed from further programming during concurrent multi-block program operations, to minimize a threshold voltage upshift in a good block. A difference in program speeds between the blocks can be quickly detected by detecting when the memory cells in each block pass a verify test, such as a verify test of a lowest programmed data state. If a first block passes the verify test at a reference program loop, a determination is made as to whether a second block passes the verify test within a specified number of additional program loops. If the second block meets this criterion, the program operation can continue for both blocks. However, if the second block does not meet this criterion, the program operation is terminated for the second block by isolating it from subsequent program and verify signals.

15 Claims, 23 Drawing Sheets

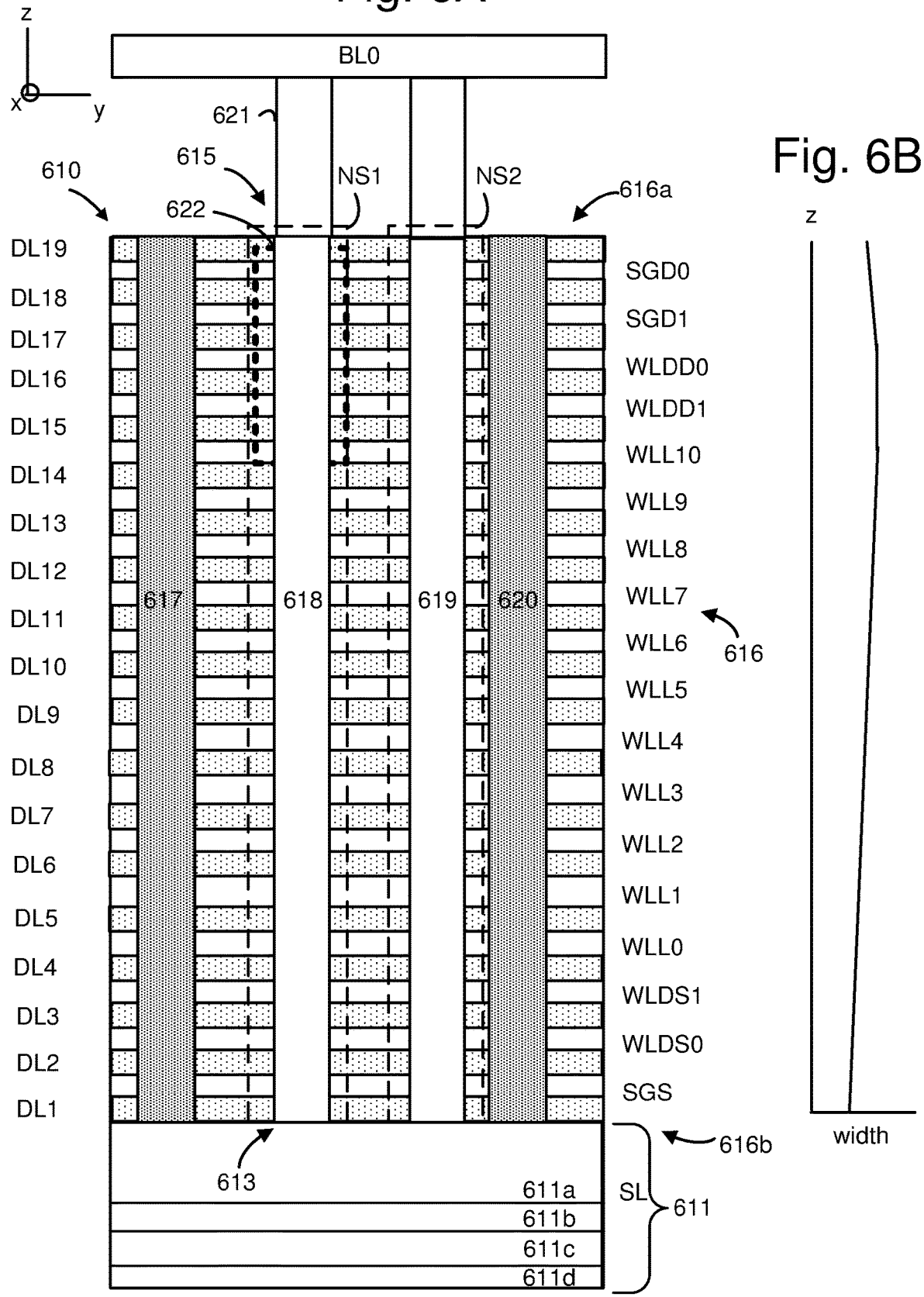

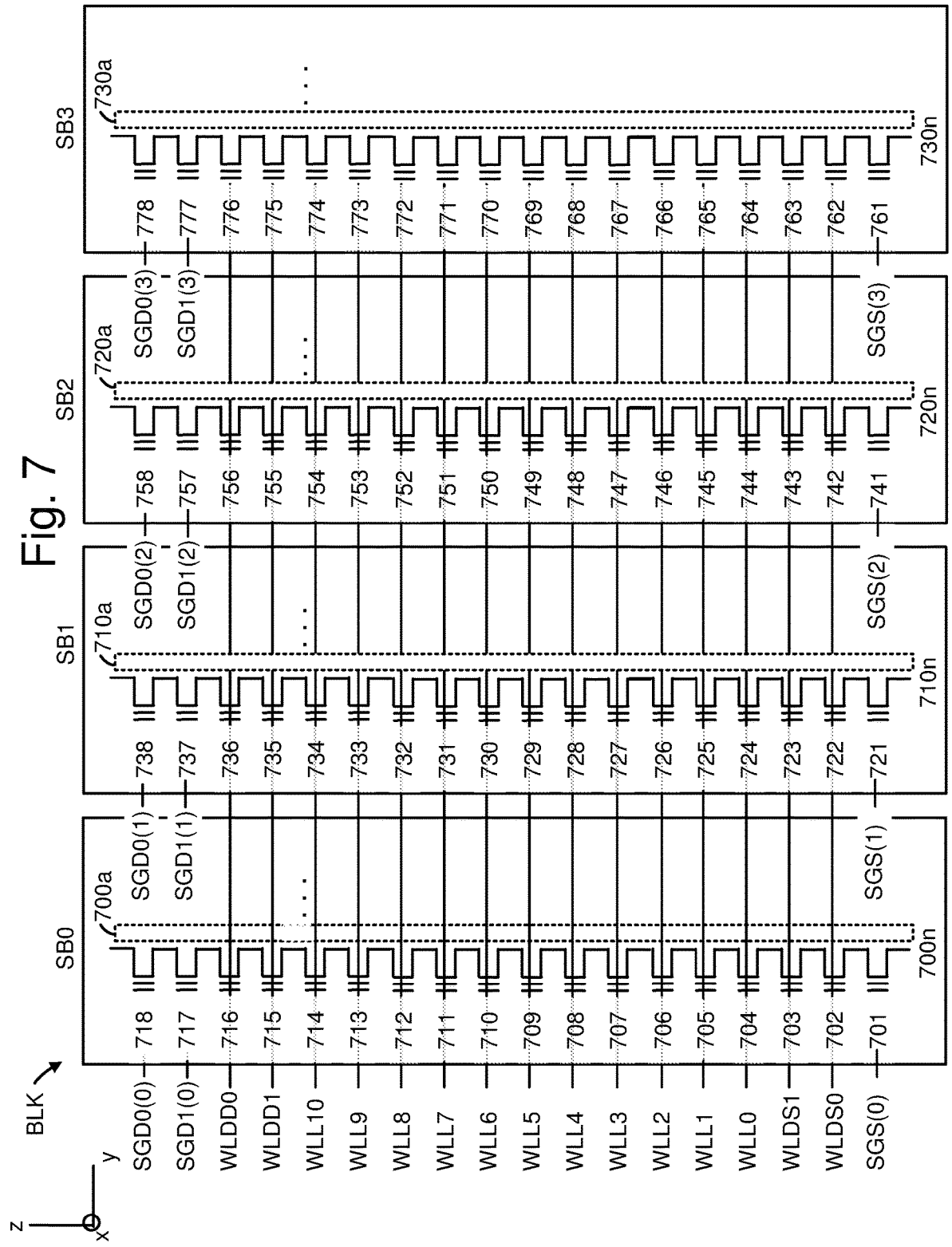

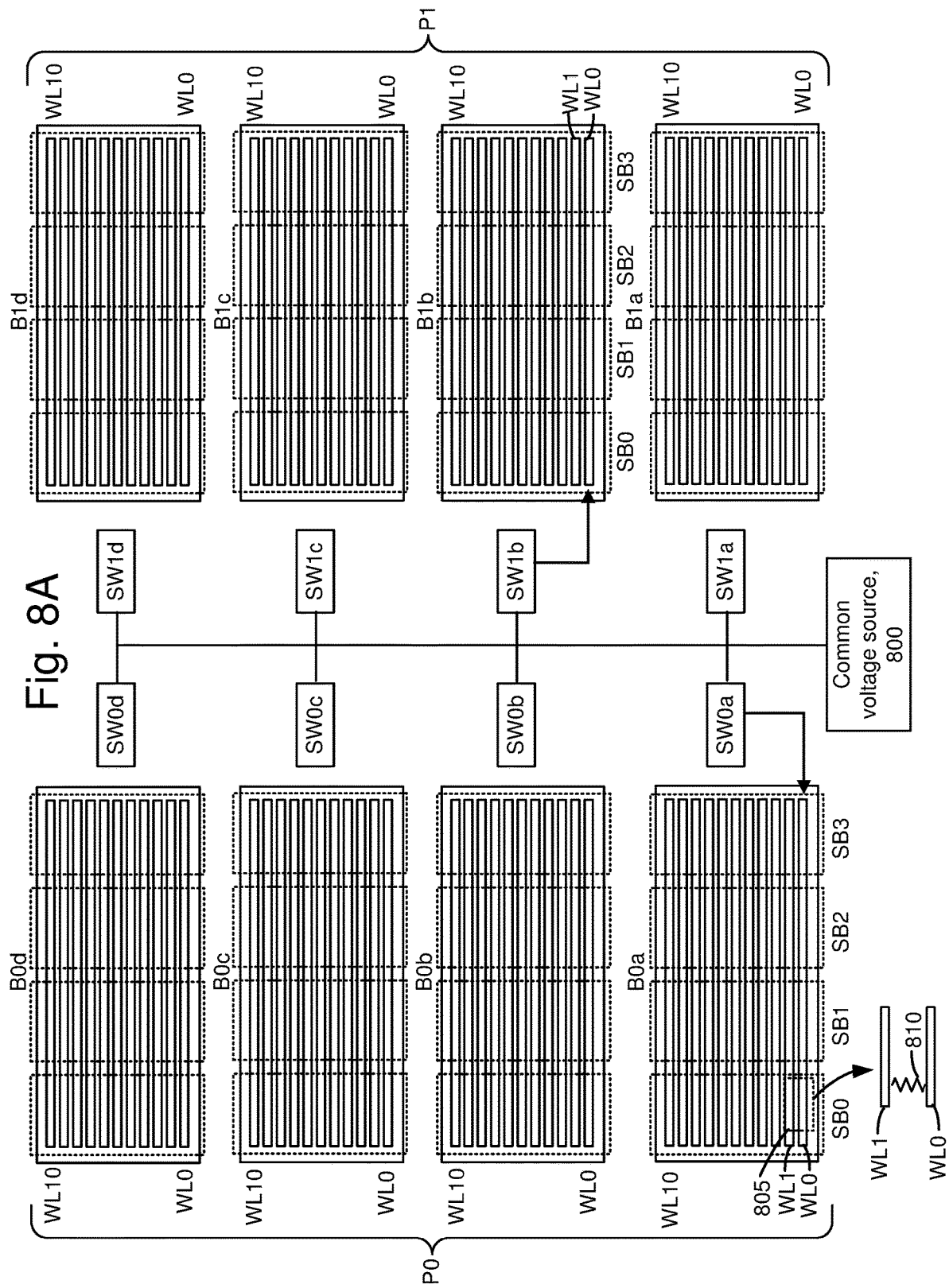

| WL0 in B0a | B 810 | A 811 | D 812 | F 813 | Er 814 | A 815 | G 816 | B 817 | ... | ← 830 | Fig. 8B |

| WL0 in B1b | E 820 | Er 821 | A 822 | G 823 | C 824 | A 825 | F 826 | D 827 | ... | ← 840 | Fig. 8C |

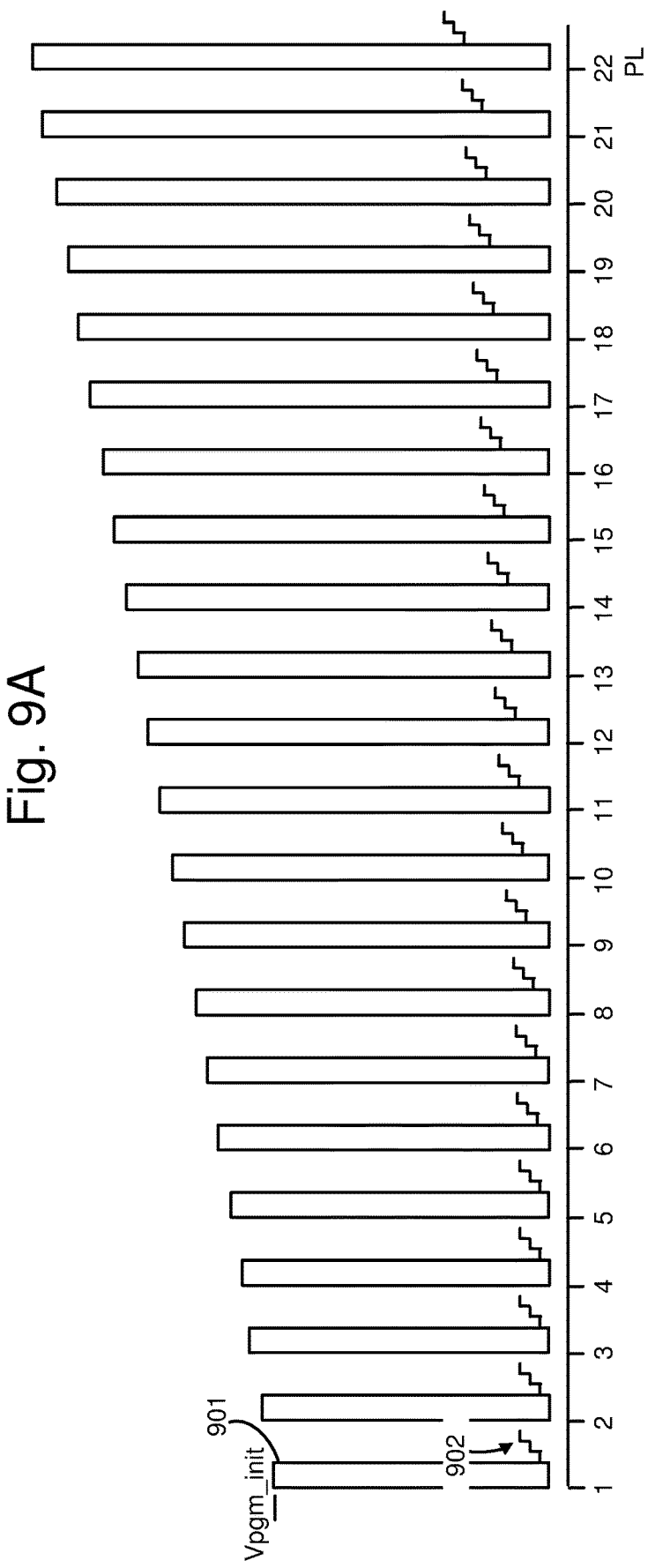

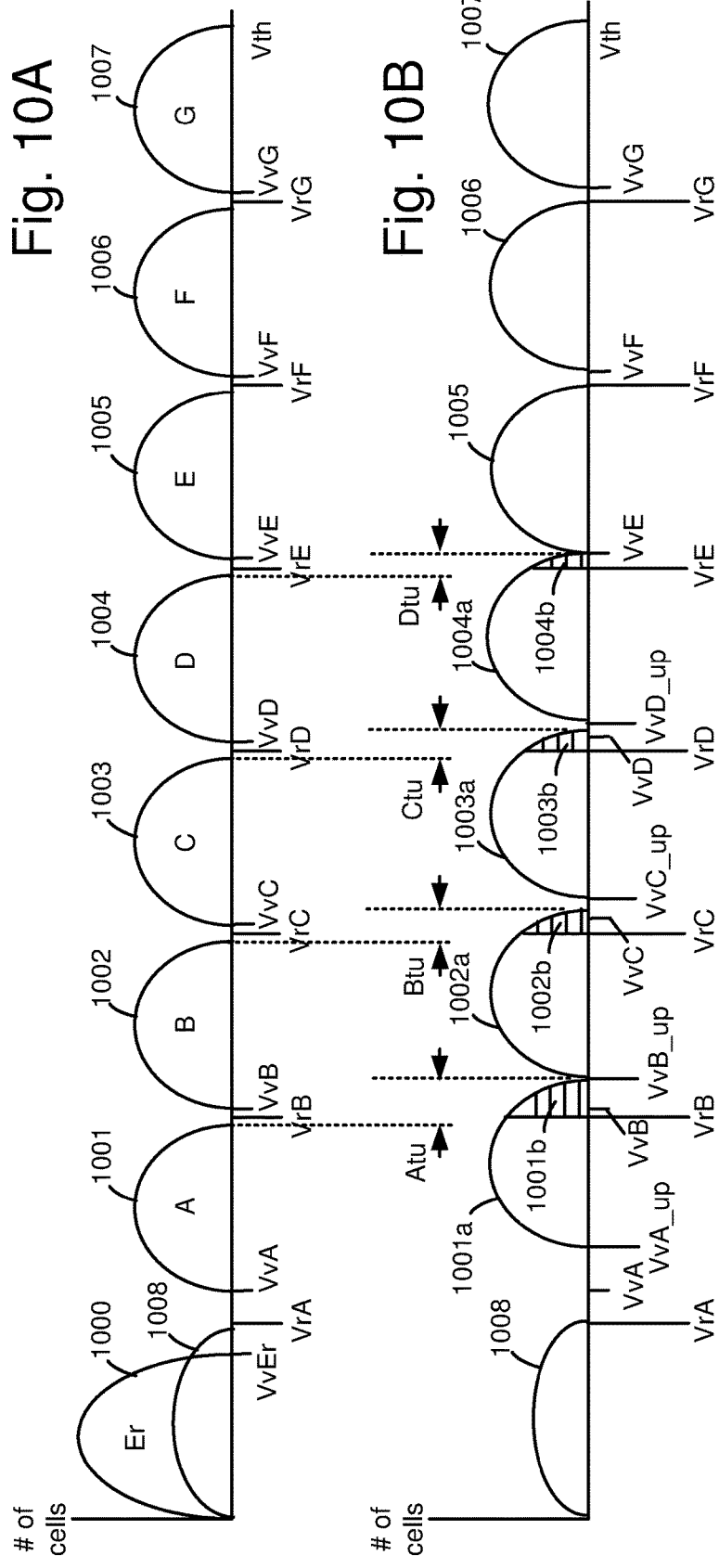

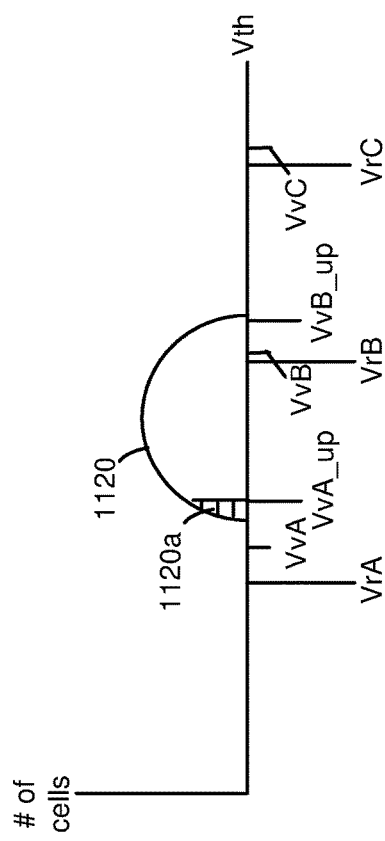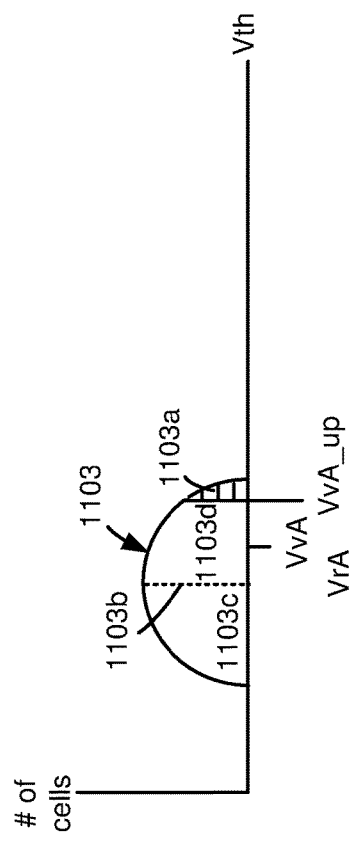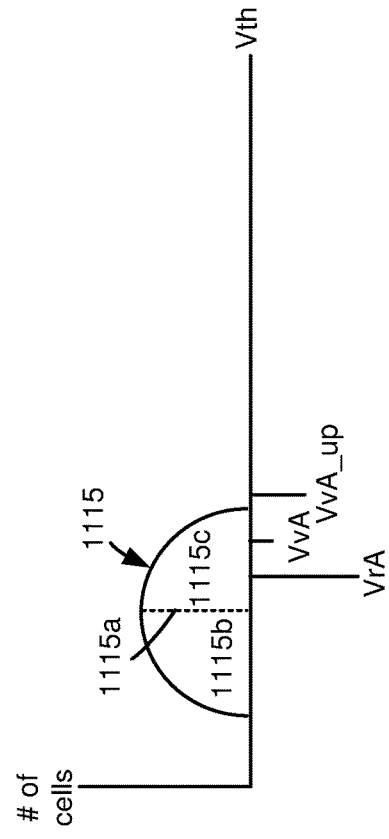

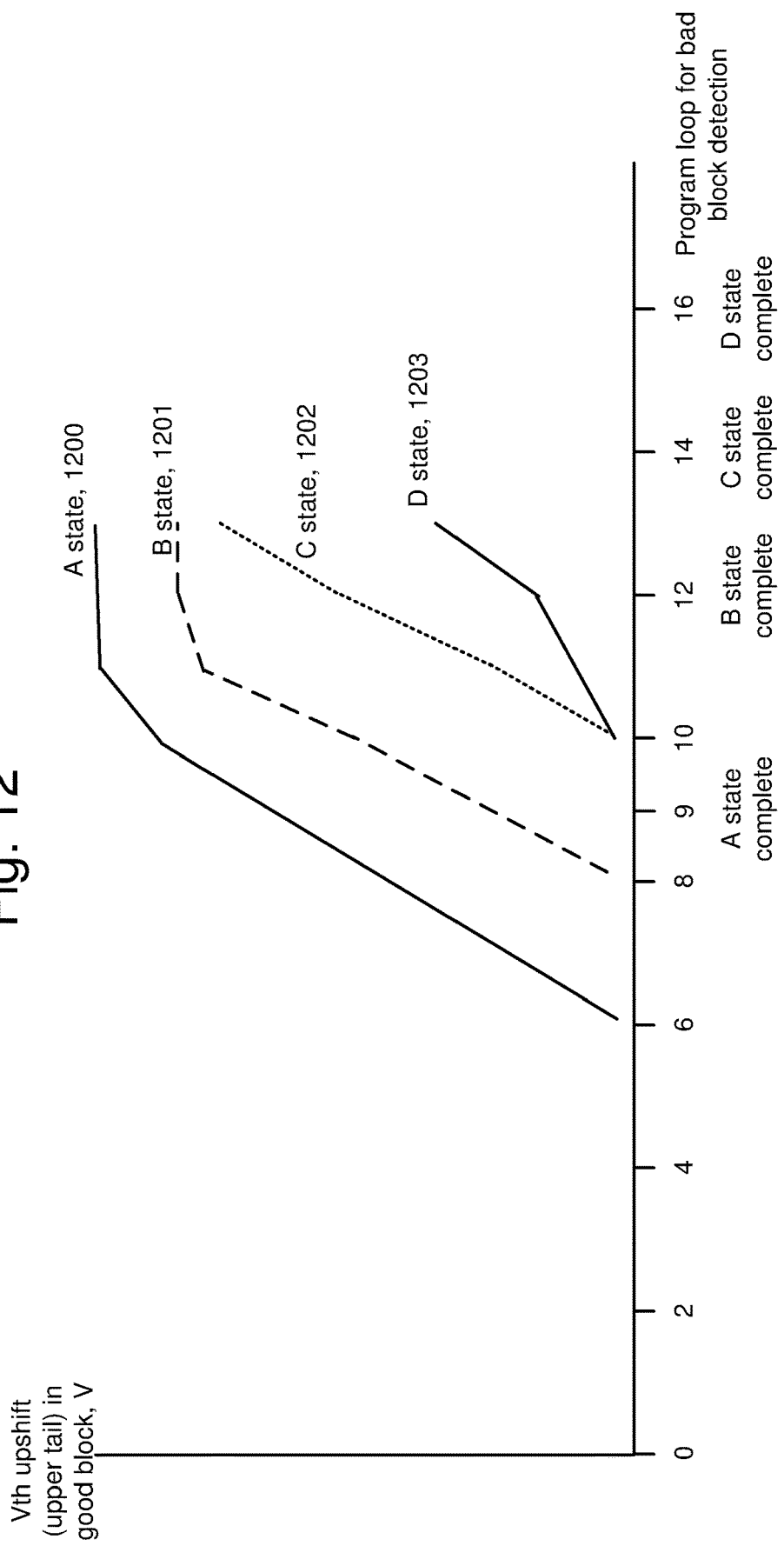

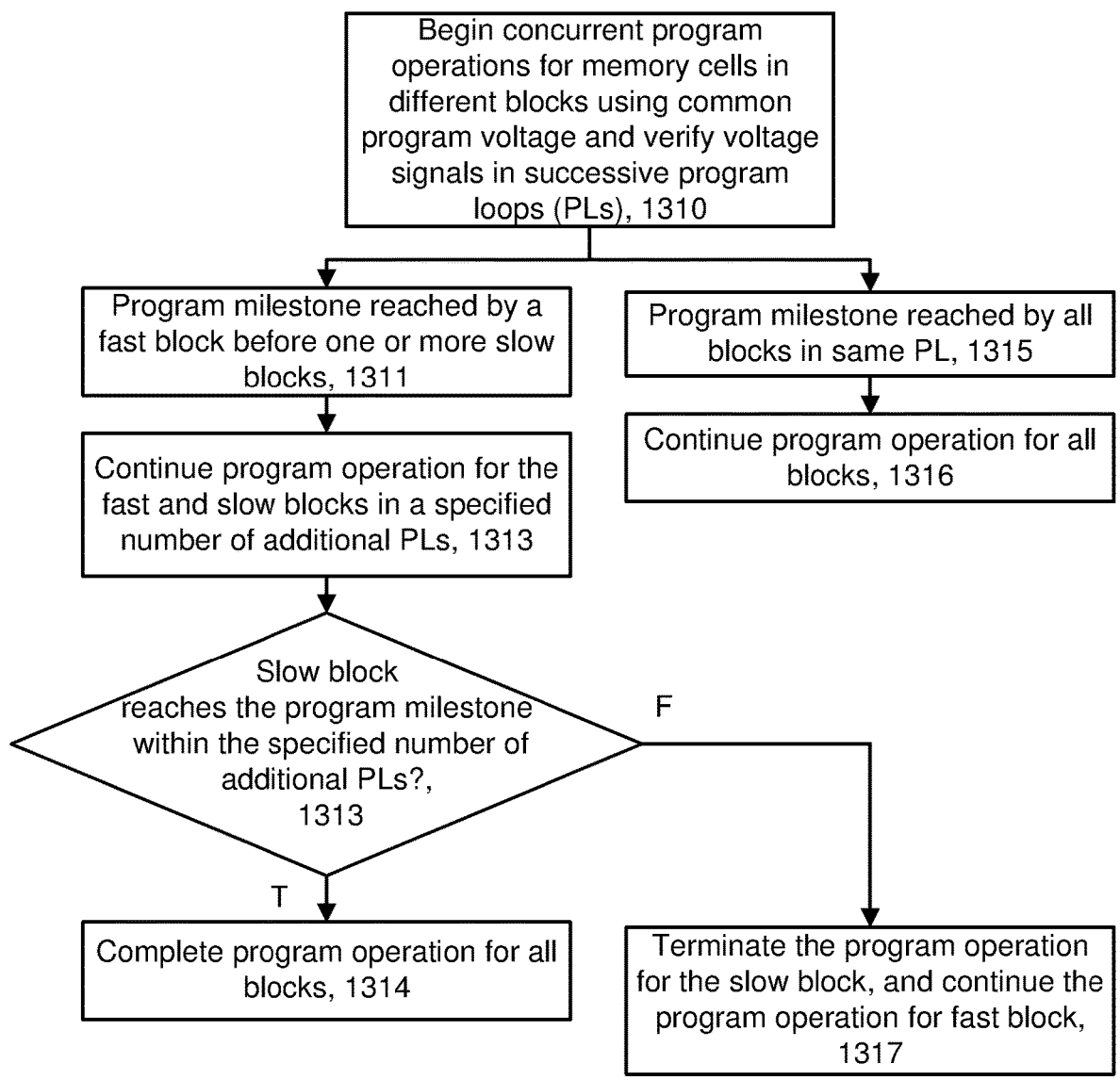

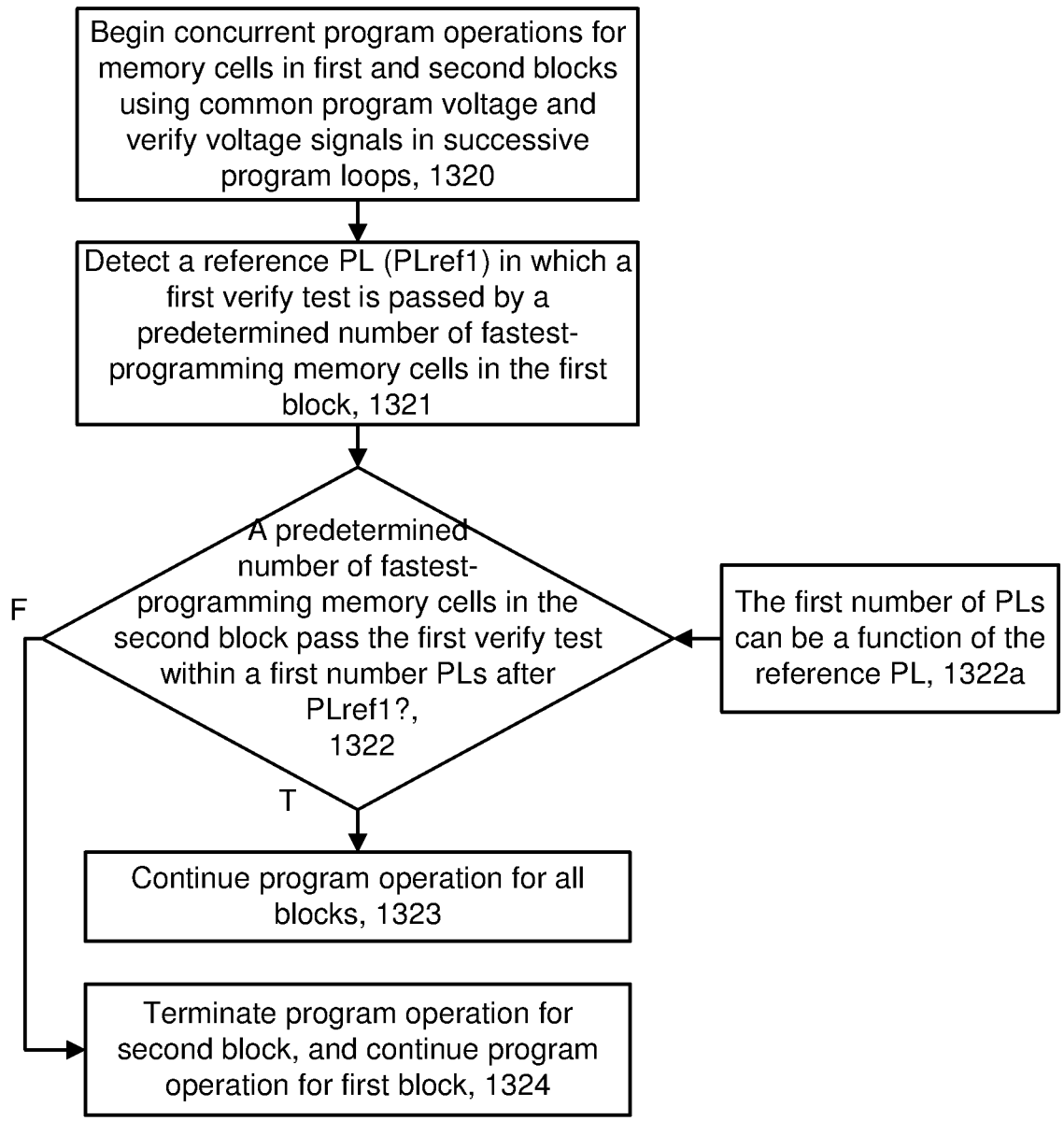

Fig. 14B

| PL | VvA | VvB | VvC | VvD | VvE | VvF | VvG |
|---|---|---|---|---|---|---|---|
| 1 | G | | | | | | |
| 2 | G | | | | | | |
| 3 | A,G | B | | | | | |
| 4 | A,G | B | | | | | |
| 5 | A,G | B | C | | | | |
| 6 | A,G | B | C | | | | |
| 7 | A | B | C | | | | |
| 8 | A | B | C | | | | |
| 9 | A | B | C | D | | | |
| 10 | A | B | C | D | | | |
| 11 | A | B | C | D | | | |
| 12 | | B | C | D | E | | |
| 13 | | B | C | D | E | F | |
| 14 | | B | C | D | E | F | |
| 15 | | B | C | D | E | F | |
| 16 | | | | D | E | F | G |
| 17 | | | | D | E | F | G |
| 18 | | | | D | E | F | G |
| 19 | | | | | E | F | G |
| 20 | | | | | E | F | G |
| 21 | | | | | E | F | G |
| 22 | | | | | E | | G |

Slowdown for A-C state cells (PL 1–6)

Verify voltage

Fig. 14A

| PL | VvA | VvB | VvC | VvD | VvE | VvF | VvG |
|---|---|---|---|---|---|---|---|
| 1 | A | | | | | | |
| 2 | A | B | | | | | |
| 3 | A | B | | | | | |
| 4 | A | B | | | | | |
| 5 | A | B | C | | | | |
| 6 | A | B | C | | | | |
| 7 | A | B | C | | | | |
| 8 | A | B | C | | | | |
| 9 | A | B | C | D | | | |
| 10 | | B | C | D | E | | |
| 11 | | B | C | D | E | | |
| 12 | | B | C | D | E | | |
| 13 | | B | C | D | E | F | |
| 14 | | B | C | D | E | F | |
| 15 | | | C | D | E | F | G |
| 16 | | | | D | E | F | G |
| 17 | | | | D | E | F | G |
| 18 | | | | | E | F | G |
| 19 | | | | | E | F | G |
| 20 | | | | | | F | G |
| 21 | | | | | | F | G |
| 22 | | | | | | | G |

Verify voltage

FAST DETECTION OF DEFECTIVE MEMORY BLOCK TO PREVENT NEIGHBOR PLANE DISTURB

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in memory strings, for instance, where select gate transistors are provided at the ends of the memory string to selectively connect a channel of the memory string to a source line or bit line. However, various challenges are presented in operating such memory devices.

BRIEF DESCRIPTION OF THE DRAWINGS

FIG. 6A depicts an example cross-sectional view of a portion of one of the blocks of FIG. 5.

FIG. 6B depicts an example variation in the width of the memory holes of FIG. 6A along their height.

FIG. 7 depicts an example view of NAND strings in sub-blocks in a 3D configuration which is consistent with FIG. 6A.

FIG. 8A depicts memory cells arranged in blocks in two planes, P0 and P1, with a common voltage source 800, consistent with the memory structure 126 of FIG. 1 and with FIG. 4.

FIG. 8B depicts example memory cells in WL0 in block B0a in FIG. 8A.

FIG. 8C depicts example memory cells in WL0 in block B1b in FIG. 8A.

FIG. 9A depicts a voltage signal used in a series of program loops in an example program operation for the two planes of FIG. 8A, where the program voltage steps up in each program loop.

FIG. 10A depicts an example Vth distribution of sets of memory cells in a good block which completes a program operation.

FIG. 10B depicts an example Vth distribution of a set of memory cells in a good block which is programmed concurrently with a bad block, where a Vth upshift is significant in the good block due to a late detection of the bad block.

FIG. 10C depicts an example Vth distribution of a set of memory cells in a good block which is programmed concurrently with a bad block, where a Vth upshift is minimal in the good block due to an early detection of the bad block.

FIG. 11E depicts an example Vth distribution of memory cells in a good block which reach a lockout condition of an assigned data state, as an example of the late detection referred to in FIG. 10B.

FIG. 11F depicts the Vth distribution 1103 of FIG. 10A, showing fastest-programming memory cells and slowest-programming memory cells in a good block.

FIG. 11G depicts the Vth distribution 1115 of FIG. 11D, showing fastest-programming memory cells and slowest-programming memory cells in a bad block.

FIG. 12 depicts a plot showing an upshift in the upper tail of a Vth distribution for memory cells in a good block versus a program loop at which a bad block is detected, in a concurrent programming operation.

FIG. 13B depicts a flowchart of an example concurrent programming operation for multiple blocks, where a bad block is detected based on a programming speed difference among the blocks.

FIG. 13C depicts a flowchart of an example concurrent programming operation for multiple blocks, where a bad block is detected based on a programming speed difference among the blocks for fastest-programming memory cells.

FIG. 14A depicts a table showing which verify tests are performed in which program loop in an example program operation consistent with FIG. 9A.

FIG. 14B depicts another table showing which verify tests are performed in which program loop in an example program operation consistent with FIGS. 9B and 9C, where a slowdown measure is applied to memory cells with one or more lower assigned data states during a bad block detection process.

DETAILED DESCRIPTION

Figure 1:
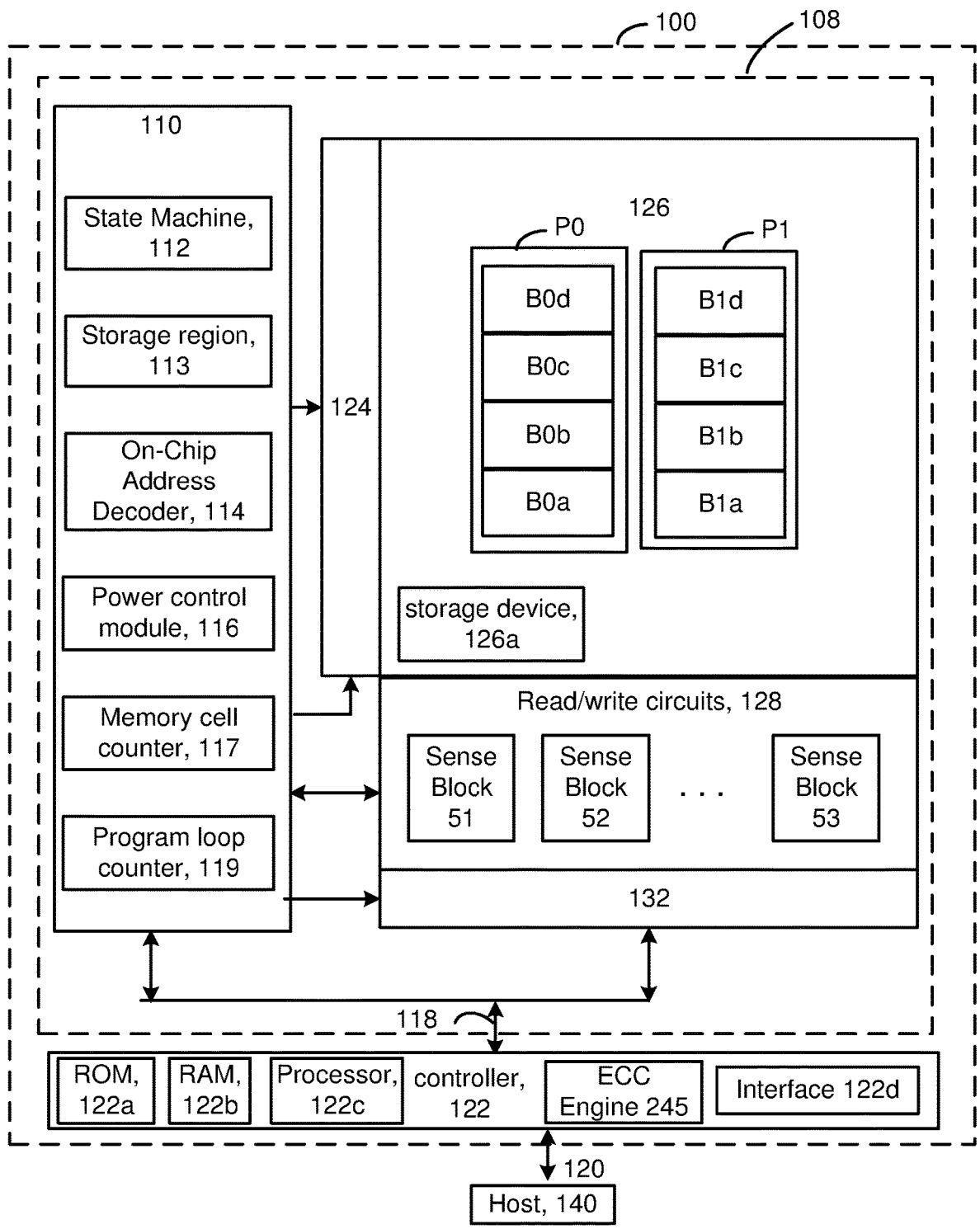
FIG. 1 is a block diagram of an example memory device comprising memory cells arranged in different planes.

Apparatuses and techniques are described for quickly detecting a bad block in a concurrent multi-bock programming operation.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical memory strings in a stack, where the stack comprises alternating conductive and dielectric layers. The conductive layers act as word lines which are connected to the memory cells. Each memory string may have the shape of a pillar which intersects with the word lines to form the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a program operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. The memory cells may also be programmed according to a sub-block programming order, where memory cells connected to a word line are programmed in one sub-block, then a next sub-block and so forth.

A programming pass may include a series of program loops or program-verify iterations, such as depicted in FIG. 9. Each program loop includes application of a program voltage followed by one or more verify voltages. The program voltage is applied to the control gates of the memory cells and creates an electric field which draws electrons into a charge trapping layer of the memory cells, increasing the threshold voltages (Vth) of the memory cells, e.g., programming the memory cells. The program voltage, in one embodiment, causes electrons to tunnel from the channel, through a tunnel oxide layer, and into the charge trapping layer, or alternatively a floating gate. As the electrons accumulate in the charge trapping layer, the Vth of the memory cell increases. One mechanism for tunneling is Fowler-Nordheim tunneling.

The verify voltages are used in verify tests which determine whether the memory cells have completed programming to an assigned programmed data state. A memory cell completes programming when a verify test determines that its Vth exceeds a verify voltage which is applied to the control gate of the memory cell, in one approach. Different verify voltages can be used in the verify tests for memory cells which have different assigned programmed data states. A verify test is a sensing operation which senses whether a current flows through a memory cell when the verify voltage is applied. If current does not flow, i.e., the memory cell is in a non-conductive state, it is concluded that the Vth of the memory cell exceeds the verify voltage and the memory cell passes the verify test. When programming is completed for a memory cell, it can be locked out from further programming while programming continues for other memory cells in subsequent program loops.

Each memory cell may be associated with an assigned data state according to user data associated with a program command. Generally, a memory device comprises memory cells which store words of user data as code words. Each code word comprises symbols, and each data state represents one of the symbols. When a cell stores n bits of data, the symbols can have one of 2^n possible values. The symbol or data state which is to be represented by a cell is identified by one or more bits of write data in latches associated with the memory cell. This data state is the assigned data state. Each assigned data state corresponds to a different range of threshold voltages. See FIG. 10A. The erased state corresponds to the lowest range of threshold voltages, and higher data states correspond to higher ranges of threshold voltages. Moreover, an assigned programmed data state is a data state which is reached by programming a memory cell so that its Vth increases from the Vth range of the erased state to a higher Vth range. An assigned programmed data state refers to a data state which is higher than the erased state. In certain, non-volatile storage technologies, memory cells must be erased (the Vth changed to satisfy the erased state) prior to being programmed to a new state. Therefore, a programming process may be designed to change the Vth of a memory cell gradually and progressively without overshooting an assigned data state to avoid having to erase the memory cell and start over. Consequently, a programming process may include a series of program loops that shift the Vth followed by a verify operation to confirm that the Vth has increased to at least the verify Vth threshold.

Thus, based on its assigned data state, a memory cell will either remain in the erased state or be programmed to a higher data state in a program operation.

For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 10A). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage (Vth) levels of adjacent data states. During the read operation, the voltages of the unselected word lines are ramped up to a read pass level which is high enough to place the unselected memory cells in a strongly conductive state, to avoid interfering with the sensing of the selected memory cells.

In some cases, the blocks of memory cells are arranged in multiple planes on a substrate. A plane typically comprises a set of blocks, bit lines which communicate with the blocks, and column control circuitry including sense circuits which communicate with the bit lines. In some cases, each plane of memory cells is fabricated in a separate region of a common substrate. Row control circuitry, including voltage sources which provide voltages to the word lines, may be shared among multiple planes to reduce the space required for the circuitry. Concurrent program operations can be performed in which blocks in different planes, one block per plane, are subject to the same program and verify signals. However, a defect in one of the blocks can affect the programming in another block. For instance, a weak short circuit may develop between a selected word line and an adjacent unselected word line in a defective block. This tends to pull up the verify signal which is shared by the blocks, so that the verify signal seen by the blocks is upshifted to a higher than desired level. The Vth distributions of the memory cells are therefore upshifted and begin to overlap so that read errors occur. See FIG. 10B.

Techniques provided herein address the above and other issues. In one approach, a bad block is quickly detected and removed from further programming during concurrent multi-block program operations, to minimize the threshold voltage upshift in the remaining one or more good blocks. A difference in program speeds between the blocks can be quickly detected by detecting when the fastest-programming memory cells in each block pass a verify test, such as a verify test of a lowest programmed data state. For example, if a first block passes the verify test at a program loop referred to as a reference program loop, a determination is made as to whether a second block passes the verify test within a specified number of additional program loops. If the second block meets this criterion, the program operation can continue for both blocks. However, if the second block does not meet this criterion, the program operation is terminated for the second block by isolating it from subsequent program and verify signals. As a result, the programming in the good block is no longer disturbed by upshifted verify signals. Moreover, the detection occurs as soon as possible during the program operation so that the disturb is minimized.

In one approach, the specified number of additional program loops is set adaptively, as a function of the reference program loop. This helps to optimize the detection process.

In one approach, a difference in program speeds is detected a second time, later in the program operation. The specified number of additional program loops can be greater in the another (second) detection than in the initial (first) detection. This helps to detect defects which are noticeable only relatively later in the program operation.

In one approach, a difference in program speeds is detected a second time, later in the program operation, when the second block passes the verify test within a first number of additional program loops but not within a smaller, second number of additional program loops. This approach detects when the second block is noticeably slower in programming, so that a subsequent detection is appropriate, but not so slow that it is declared to be bad in the initial detection. This approach notes that some bad blocks will pass a detection which occurs relatively early in the program operation but will not pass a detection which occurs relatively later in the program operation.

In one approach, memory cells with one or more lower assigned programmed data states are subject to a slowdown measure during the detection, and the detection occurs using the Vth of memory cells with one or more higher assigned programmed data states, which are not subject to a slowdown measure. This helps to minimize or avoid Vth upshifts for these memory cells during the detection process.

These and other features are discussed further below.

FIG. 1 is a block diagram of an example memory device comprising memory cells arranged in different planes. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The memory structure 126 may comprise multiple planes, such as neighbor planes P0 and P1. Each plane may include one or more blocks of memory cells. For example, P0 includes blocks B0a-B0d and P1 includes blocks B1a-B1d.

The read/write circuits 128 include multiple sense blocks 51, 52, . . . 53 (sensing circuitry) and allow a page of memory cells to be read or programmed in parallel. Typically, a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 116, a memory cell counter 117 and a program loop counter 119. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for data and dummy word lines, SGS and SGD transistors and source lines. See also FIG. 4. The sense blocks can include bit line drivers, in one approach.

The memory cell counter 117 can be used to determine when a predetermined or other specified number of memory cells pass a verify test, such as in the processes of FIG. 13B-13E. During a verify test, sensing circuitry determines whether current flows through a memory cell when a verify voltage is applied to the memory cell. The circuitry can then set a corresponding bit which indicates whether the current flows. For example, the sense block 51 (FIG. 2) can set a bit in the bit line latch 182 which indicates that current flows (e.g., the memory cell is in a conductive state) or does not flow (e.g., the memory cells is in a non-conductive state). The processor 192 of the sense bock can compare the bit in the bit line latch 182 to the user data in one of the corresponding latches 194-197 which indicates the assigned data state of the memory cell. For example, if the current verify test involves applying a verify voltage VvA to a word line, the processor can compare the bit to the user data when the user data identifies the A state.

If the bit is consistent with the user data, indicating that the verify test is passed, the sense block outputs a binary 0, and if the bit is not consistent with the user data, indicating that the verify test is not passed, the sense block outputs a binary 1, for example. The memory cell counter receives the bits in a bitstream from the sense blocks and can count the number of 0's to obtain a count of memory cells which pass a verify test. The memory cell counter can store data which identifies the predetermined number, and compare the count to the predetermined number. If the count equals or exceeds the predetermined number, it is concluded that a predetermined number of memory cells pass the verify test. Moreover, the above process can be repeated for the verify tests of different assigned programmed data states, and for one or more program loops.

The program loop counter 119 can be used to count a number of program loops after a verify test is passed by a faster block, e.g., to determine whether the verify test is passed by a slower programming block within a specified number of additional program loops, such as in the processes of FIG. 13B-13E.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
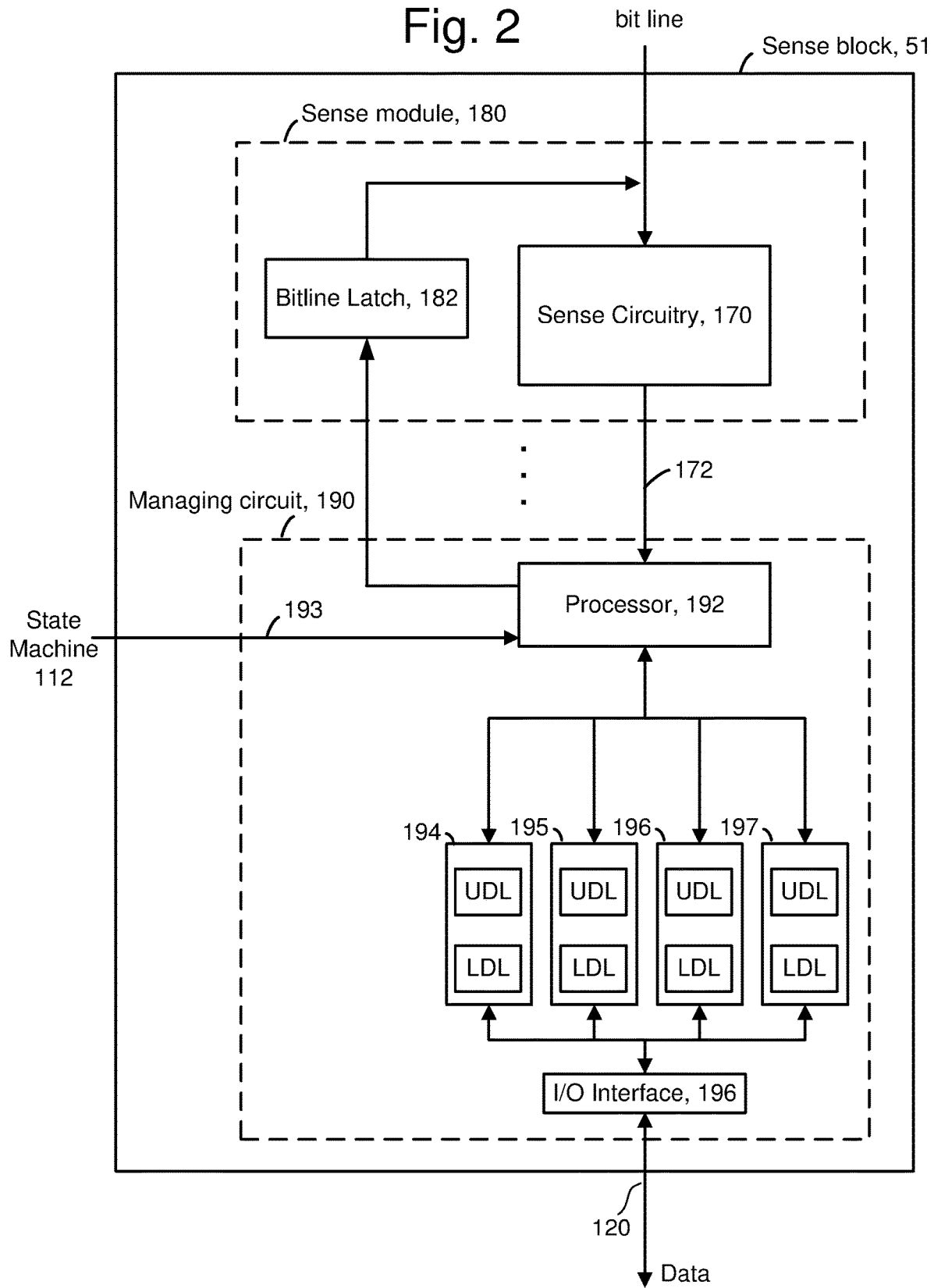
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and data latches identified by LDL and UDL may be provided for each set. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, an additional data latch may be used. The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
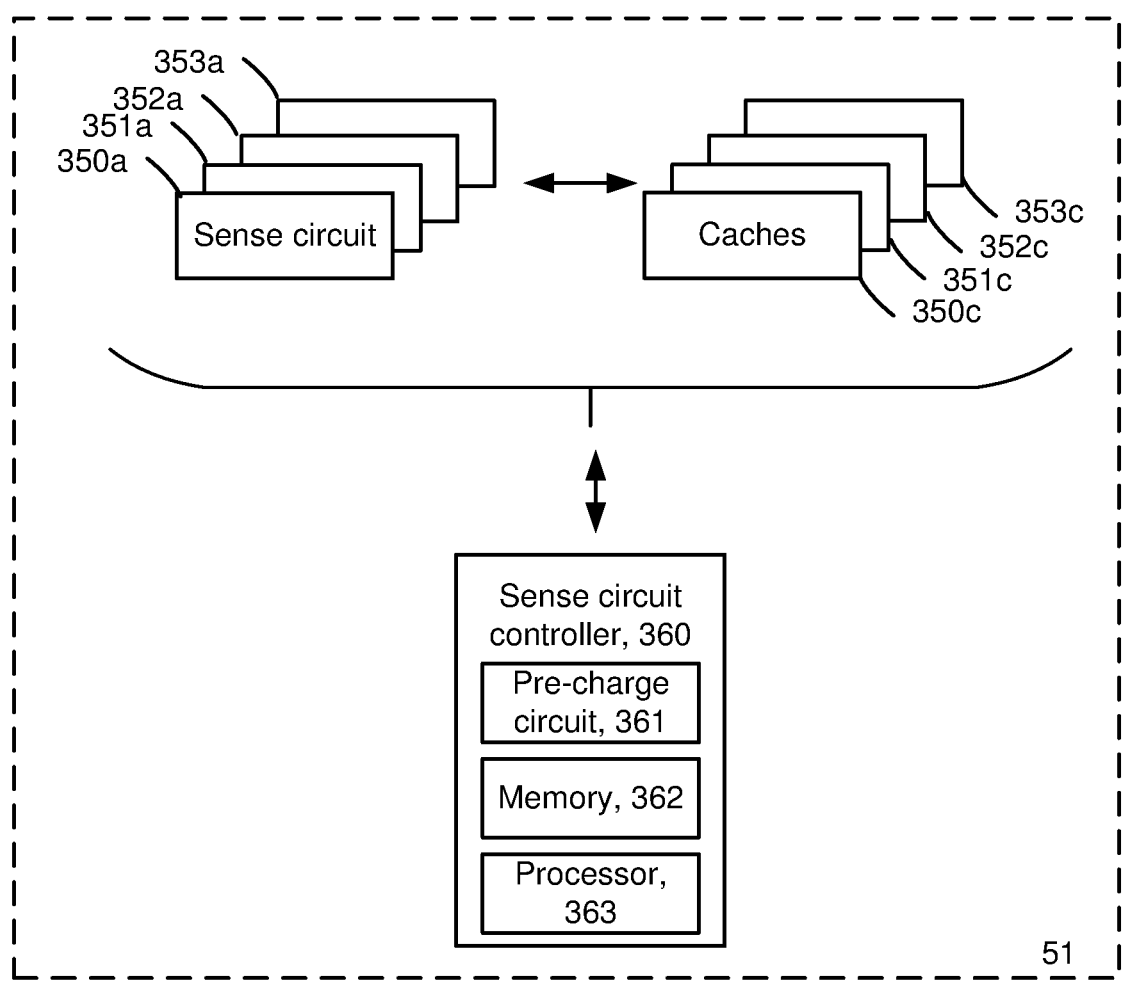
FIG. 3 depicts another example block diagram of the sense block 51 of FIG. 1.

FIG. 3 depicts another example block diagram of the sense block 51 of FIG. 1. The column control circuitry can include multiple sense blocks, where each sense block performs sensing, e.g., read, program verify or erase verify operations for multiple memory cells via respective bit lines. In one approach, a sense block comprises multiple sense circuits, also referred to as sense amplifiers. Each sense circuit is associated with data latches and caches. For example, the example sense circuits 350a, 351a, 352a and 353a are associated with caches 350c, 351c, 352c and 353c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Figure 4:
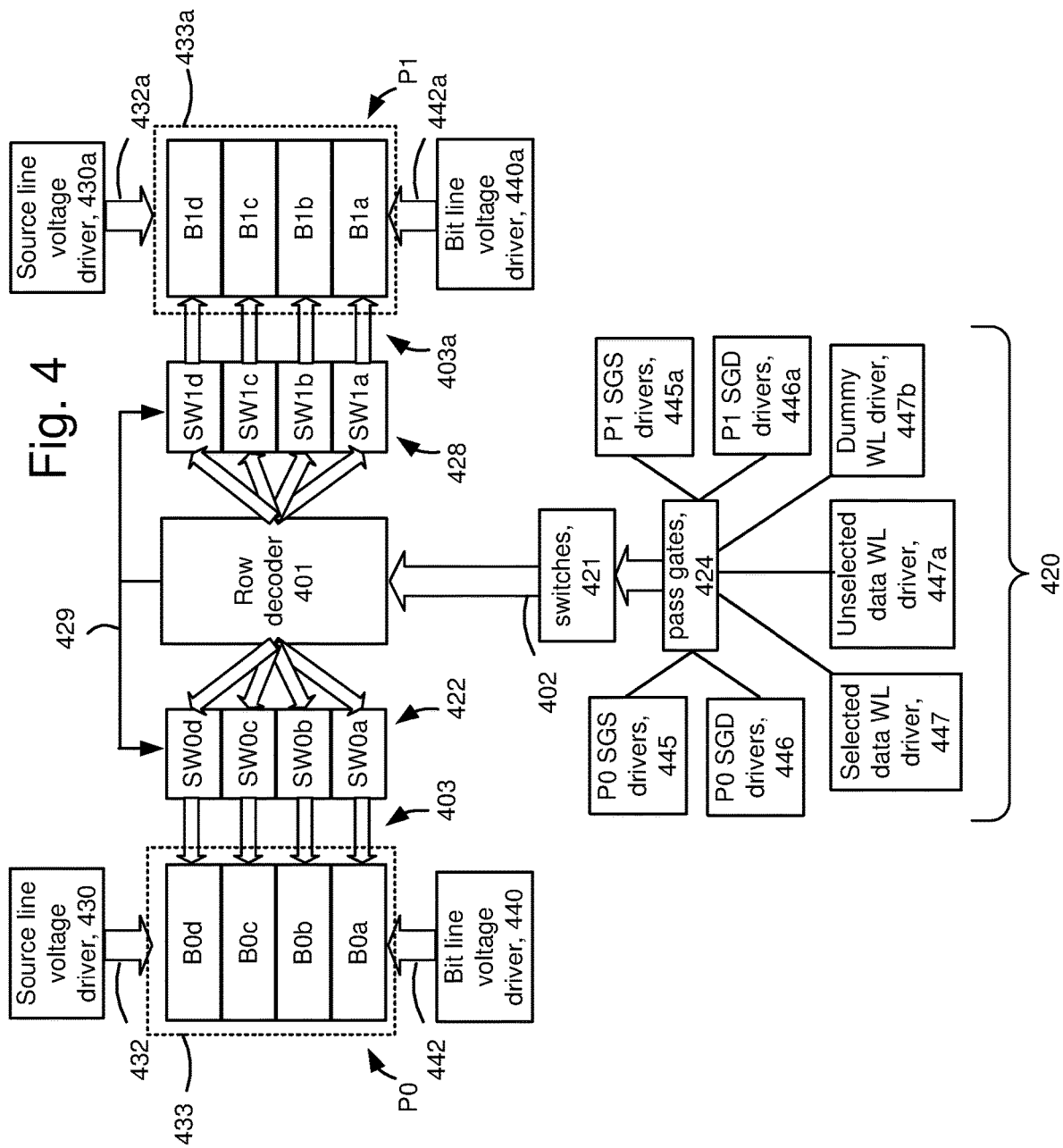
FIG. 4 depicts an example circuit for providing voltages to blocks of memory cells in the different planes of the memory device of FIG. 1.

FIG. 4 depicts an example circuit for providing voltages to blocks of memory cells in the different planes of the memory device of FIG. 1. The planes include P0 with blocks B0a-B0d on a substrate region 433 such as a source diffusion region, and P1 with blocks B1a-B1d on a substrate region 433a. A row decoder 401 is shared by the different planes and can provide a common voltage signal to word lines and select gates of a selected block in each plane. The row decoder provides control signals on a path 429 to switches SW0a-SW0d which connect the blocks in P0 to the row decoder, and to switches SW1a-SW1d which connect the blocks in P1 to the row decoder.

The row decoder can therefore connect global control lines 402 to local control lines 403 and 403a for P0 and P1, respectively. Voltage signals are provided on the global control lines from a set of voltage drivers 420. The voltage drivers may provide voltages to switches 421 which connect to the global control lines. Pass gates 424 are controlled to pass voltages from the voltage drivers 420 to the switches 421.

The set of voltage drivers 420 can include voltage drivers which provide a voltage signal for a single plane and voltage drivers which provide a common voltage signal for multiple planes. For example, P0 SGS drivers 445 and P0 SGD drivers 446 provide voltage signals for the SGS and SGD transistors, respectively, in P0. P1 SGS drivers 445a and P1 SGD drivers 446a provide voltage signals for the SGS and SGD transistors, respectively, in P1. A selected data word line (WL) driver 447 provides a common voltage signal for a selected data word line in each of P0 and P1, an unselected data WL driver 447a provides a common voltage signal for unselected data word lines in each of P0 and P1, and a dummy data WL driver 447b provides a common voltage signal for dummy word lines in each of P0 and P1.

In one approach, multiple SGS and SGD drivers can be provided for each plane, where a separate SGS and SGD driver is provided for each sub-block. For example, four SGS drivers and four SGD drivers can be provided for each plane, consistent with FIG. 7.

The various components, including the row decoder, may receive commands from a controller such as the state machine 112 or the controller 122 to perform the functions described herein.

For P0 and P1, source line voltage drivers 430 and 430a provide the voltage Vsl to the source lines/diffusion region in the substrate regions 433 and 433a, respectively, via control lines 432 and 432a, respectively. For example, an erase voltage can be provided to the substrate in an erase operation. In one approach, the source diffusion region is common to the blocks in each plane. A set of bit lines 442 and 442a is also provided for P0 and P1, respectively. Within a plane, the bit lines are shared by the blocks in the plane. Bit line voltage drivers 440 and 440a provide voltages to the bit lines in P0 and P1, respectively.

To save time, operations such as program, read or erase, can be performed concurrently on one selected block in each plane.

Figure 5:
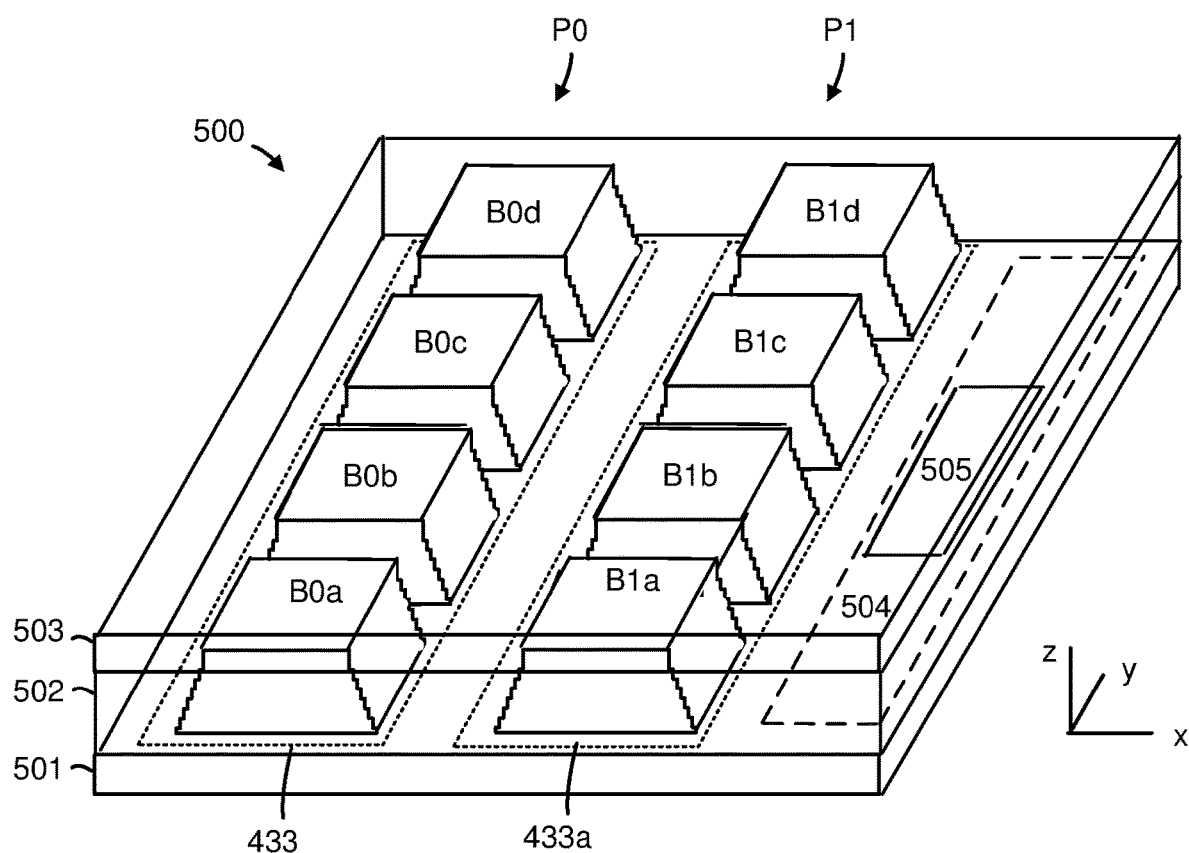
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1. Two planes P0 and P1 of blocks of memory cells (storage elements), consistent with FIG. 1, are formed on a substrate 501. The blocks are formed in an intermediate region 502 of the memory device. P0 includes blocks B0a-B0d, and P1 includes blocks B1a-B1d.

A peripheral area 504 of the substrate includes circuitry for use by the blocks, such as voltage drivers 505 which can be connected to control gate layers of the blocks. In one approach, control gate layers at a common height in the blocks are commonly driven. The substrate 501 can also carry circuitry under the blocks, along with one or more lower metal layers which are patterned in conductive paths to carry signals of the circuitry. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks per plane are depicted as an example, any number of blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6C:
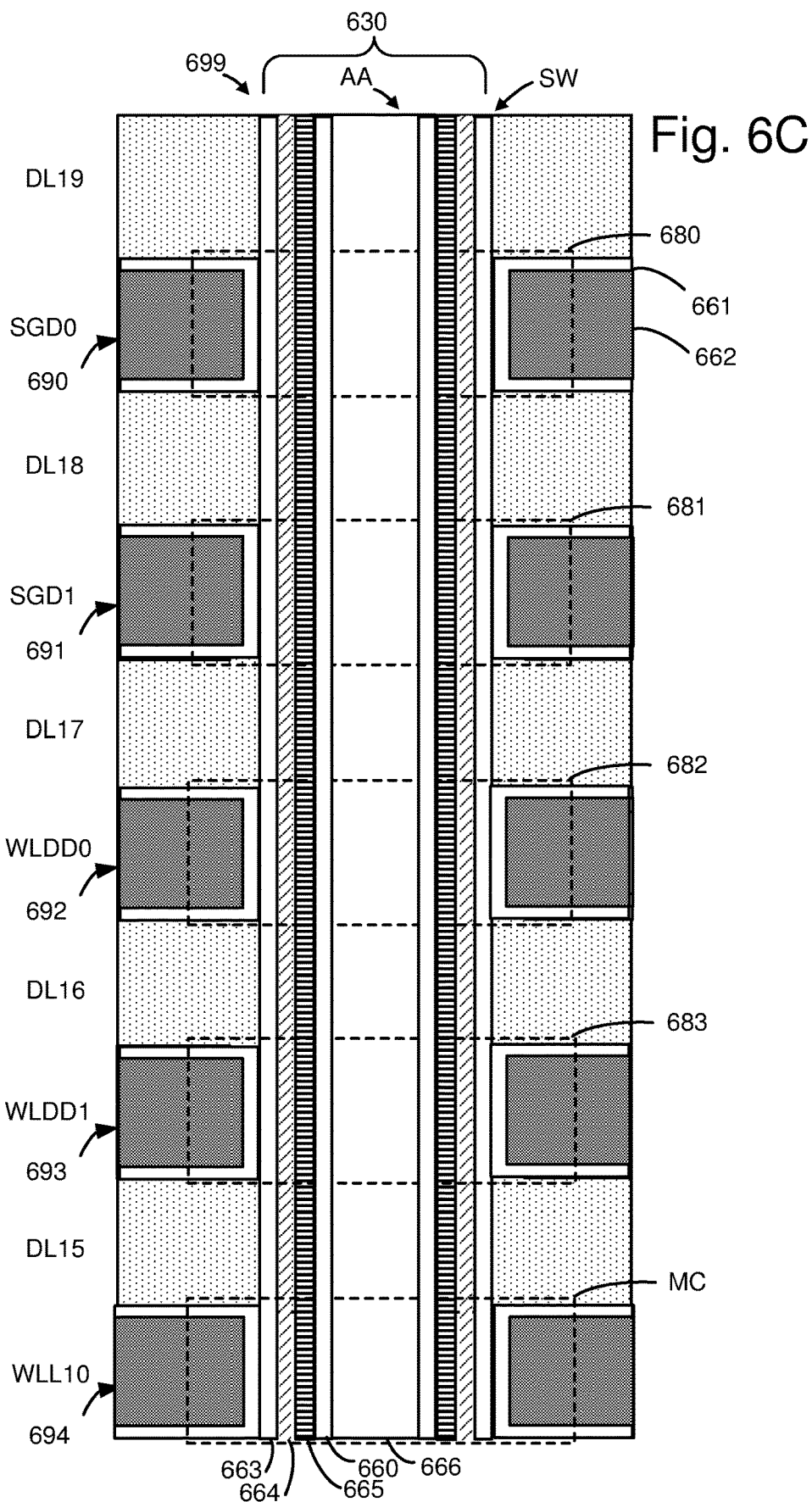
FIG. 6C depicts a close-up view of the region 622 of the stack of FIG. 6A.

FIG. 6A depicts an example cross-sectional view of a portion of one of the blocks of FIG. 5. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings NS1 and NS2 are depicted. Each NAND string encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises an n-type source diffusion layer 611a in the substrate which is in contact with a source end of each string of memory cells in a block. An erase voltage may be applied to this layer in an erase operation The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts an example variation in the width of the memory holes of FIG. 6A along their height. Due to the etching process used to create the memory holes, and the very high aspect ratio, the cross-sectional width, e.g., diameter, of a memory hole can vary along its height. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the corresponding width of the vertical pillar which is formed in the memory hole, the programming and erase speed of the memory cells can vary based on their position along the memory hole, e.g., based on their height in the stack. With a smaller diameter memory hole, the electric field across the tunneling layer is stronger, so that the programming and erase speed is higher.

In this case, the memory cells are arranged along vertically-extending memory holes in the memory device, and a width of the vertically-extending memory holes varies along a height of the memory device. Further, this example shows that the memory hole is created by etching through the stack of layers which include word line layers and select gate layers. In one variation, the word line layers are etched through before the SGD layers are deposited and subsequently etched through separately. In another variation, one set of word line layers is deposited and etched through, then another set of word line layers is deposited and etched through. The memory hole diameter can differ from that shown in these different variations.

FIG. 6C depicts a close-up view of the region 622 of the stack of FIG. 6A. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a blocking oxide layer 663, a charge-trapping layer 664 or film such as silicon nitride (Si3N4) or other nitride, a tunneling layer 665, a channel 660 (e.g., comprising polysilicon), and a dielectric core 666. A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each memory string comprises a channel which extends continuously from one or more source-end select gate transistors to one or more drain-end select gate transistors.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7 depicts an example view of NAND strings in sub-blocks in a 3D configuration which is consistent with FIG. 6A. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line. For simplicity, only one NAND string per sub-block is depicted in FIG. 7. Programming of the block may occur based on a word line programming order. Moreover, one option is to program the memory cells in different portions of a word line which are in the different sub-blocks, one sub-block at a time, before programming the memory cells of the next word line. Another option programs all of the memory cells in one sub-block, one word line at a time, before programming the memory cells of the next sub-block. The word line programming order may start at WL0, the source-end word line, and end at WLL10, the drain-end word line, for example.

The NAND strings 700n, 710n, 720n and 730n have channels 700a, 710a, 720a and 730a, respectively.

Additionally, NAND string 700n includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistor 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

One or more SGD transistors are provided at the drain-end of each memory string, and one or more SGS transistors are provided at the source-end of each memory string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by control lines SGS(0), SGS(1), SGS(2) and SGS(3), respectively.

FIG. 8A depicts memory cells arranged in blocks in two planes, P0 and P1, with a common voltage source 800, consistent with the memory structure 126 of FIG. 1 and with FIG. 4. Each block includes eleven word lines, WL0-WL10 and four sub-blocks, SB0-SB3, consistent with FIG. 7. A switch is provided between each block and the common voltage source, which can represent the word line drivers 447, 447a and 447b, for instance, in FIG. 4. The switches SW0a, SW0b, SW0c and SW0d are provided between the voltage source and blocks B0a, Bob, B0c and B0d, respectively. This example shows that SW0a is conductive and can route program and verify signals from the voltage source to a selected word line, e.g., WL0, in P0. B0a (a first block) is the selected block in P0, and B0b-B0d are unselected blocks. SW0a can also route a pass voltage signal to the unselected word lines WL1-WL10 of B0a. SW0b, SW0c and SW0d can be provided in a non-conductive state so that a voltage is not provided to the unselected blocks in P0.

Further, SW1b is conductive and can route the same program and verify signals from the voltage source to a selected word line, e.g., WL0, in P1. B1b (a second block) is the selected block in P1, and B1a, B1c and B1d are unselected blocks. SW1b can also route a pass voltage signal to the unselected word lines WL1-WL10 in B1b. SW1a, SW1c and SW1d can be provided in a non-conductive state so that a voltage is not provided to the unselected blocks in P1. In one approach, which allows for a simpler design, the same word line number is selected in both planes (e.g., WL0 in B0a and B1b) during a concurrent program operation. However, it is also possible to configure the memory device to select different word line numbers in the different planes (e.g., WL0 in B0a and WL5 in B1b). Further, the selected block in a plane can be selected independently from the selected block in another plane.

WL1 in B0a is identified as an adjacent word line to WL0 in B0a and WL1 in B1b is identified as an adjacent word line to WL0 in B1b. In one example, suppose a possible defect involves a short circuit between WL0 and WL1 in B0a. For example, a region 805 of the block B0a shows a resistive path as a short circuit 810 between WL0 and WL1. This will tend to pull up the common verify signal (meaning the common verify signal will increase) which is applied to WL0 in B0a and WL0 in B1b. In particular, in one embodiment, during a verify test involving WL0, WL1 may have a pass voltage such as 8-10 V, while WL0 will have a verify voltage of about 0-5 V, depending on the data state being verified. The 5 V applies to the verify test of the highest programmed data state and the 0 V applies to the verify test of the lowest programmed data state. The verify signal will be pulled up, or increased, by an amount which is a function of the difference between the pass voltage and the voltage of the verify signal. Thus, the pull up will be greater for the verify voltages of the lower data states than for the verify voltages of the higher data states.

The pull up occurs because the short circuit allows the higher voltage signal of WL1 to reach WL0. The pull up increases the verify voltage on WL0 to a level which is between the verify voltage of WL0 and the pass voltage signal of WL1. The voltage of WL1 generally is not pulled down by WL0 because WL1 is driven with many other unselected word lines by an unselected word line voltage driver 447a (FIG. 4) which has a higher capacity or ability to drive a load than a selected word line voltage driver 447. The unselected word line voltage driver has this higher capacity because it is designed to drive multiple word line layers concurrently while selected word line voltage driver is designed to drive a single word line layer.

A short circuit path between adjacent word lines may be in the dielectric layer which is between the word lines, or between conductive lines which connect voltages to the word lines, for instance. The short circuit prevents the word lines from holding separate voltages, as current will leak between the word lines. In some cases, the short circuit is a nascent or soft short circuit such that the current leakage is relatively small and the word lines can hold separate voltages to some extent. A short circuit can be caused for various reasons such as variations or defects in the fabrication of the memory device. Moreover, the formation of a short circuit between word lines can be induced by the existence of a relatively large electric field between the word lines. Such a field exists during programming, when a large program voltage such as 20-25 V is applied to a selected word line being programmed and a lower read pass voltage such as 8-10 V is applied to the remaining unselected word lines.

When a short circuit is formed between a selected word line WL0 and an adjacent unselected word line such as WL1, the voltage on WL0 is pulled closer to the voltage on WL1. As mentioned, a verify voltage signal on WL0 will be pulled higher because the pass voltage on WL1 is higher than the verify voltage. On the other hand, a program voltage signal on WL0 will be pulled down because the pass voltage on WL1 is lower than the program voltage. This can prevent the memory cells of WL0 from successfully completing a program operation. The pull up and/or pull down of the voltage on WL0 in the defective block B0a will also occur in WL0 in the good block B1b since the voltage signals on WL0 are shared by these blocks at the start of a program operation, in this example. That is, the program and verify voltage signals are shared by WL0 in B0a and WL0 in B1b, and the pass voltage signals are shared by WL1 in B0a and WL1 in B1b, in the example in which WL0 is the selected word line in B0b and B1b.

Block B0a, which has a short circuit, is an example of a bad or defective block, and block B1b, which does not have a short circuit, is an example of a good or non-defective block.

FIG. 8B depicts example memory cells in WL0 in block B0a in FIG. 8A. Eight representative memory cells are depicted as an example, in a first set of memory cells 830, to show how the assigned data states can vary randomly among the memory cells. In practice, many more memory cells are connected to a word line. The memory cells and their assigned data states are: 810 (B), 811 (A), 812 (D), 813 (F), 814 (Er), 815 (A), 816 (G) and 817 (B). With eight data states, the bottom half may be considered to be lower data states, e.g., states Er-C and the top half may be considered to be higher data states, e.g., states D-G. Moreover, states A-C may be considered to be lower programmed data states while states D-G may be considered to be higher programmed data states. The memory cells with the lower assigned data states are subject to a greater amount of upshift than the memory cells with the higher assigned data states, when a bad block, e.g., a block with a defect such as a short circuit between adjacent word lines, is connected to a good block, e.g., a block which is non-defective and does not have a short circuit between adjacent word lines, in a concurrent program operation. See also FIGS. 10B and 10C.

In some examples, the A-state memory cells 811, 815, 822 and 825 are subject to a first verify test of the A-state using a verify voltage VvA which is pulled up to VvA_up.

FIG. 8C depicts example memory cells in WL0 in block B1b in FIG. 8A. In a second set of memory cells 840, the memory cells and their assigned data states are: 820 (E), 821 (Er), 822 (A), 823 (G), 824 (C), 825 (A), 826 (F) and 827 (D).

FIG. 9A depicts a voltage signal, e.g., waveform, used in a series of program loops in an example program operation for the two planes of FIG. 8A, where the program voltage steps up in each program loop. The horizontal axis denotes a program loop number, ranging from 1-22, and the vertical axis denotes voltage. During a program operation, program loops are performed for a selected word line in a selected block in each plane. A program loop comprises a program portion in which a program voltage or pulse is applied to the selected word line followed by a verify portion in which a verify signal is applied to the selected word line while one or more verify tests are performed for the associated memory cells. Other than the erased state, each assigned state has a verify voltage which is used in the verify test for the state in a program operation.

The voltage signal 900 includes a series of program voltages, including an initial program voltage 901, which are applied to the word lines selected for programming in the two planes, e.g., WL0 in B0a of P0 and WL0 in B1b of P1. In this example, the voltage signal includes program voltages which increase stepwise in amplitude in one or more program loops of a programming pass using a fixed or varying step size. This is referred to as incremental step pulse programming, where the program voltage starts at an initial level Vpgm_int (see program voltage 901) and increases in a step in each successive program loop, for instance, until the program operation is completed. A successful completion occurs when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 902, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification. More detailed examples of the verify signals are provided in FIGS. 14A and 14B.

All memory cells may initially be in the erased state at the beginning of the program operation, for instance. After the program operation is completed, a Vth distribution similar to that in FIG. 10A or 10C ideally is achieved, and the data can be read from the memory cells using read voltages which are between the Vth distributions. At the same time, a read pass voltage, Vread pass (e.g., 8-10 V), also referred to as Vread, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. See also FIG. 10A to 10C. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

Figure 9B:
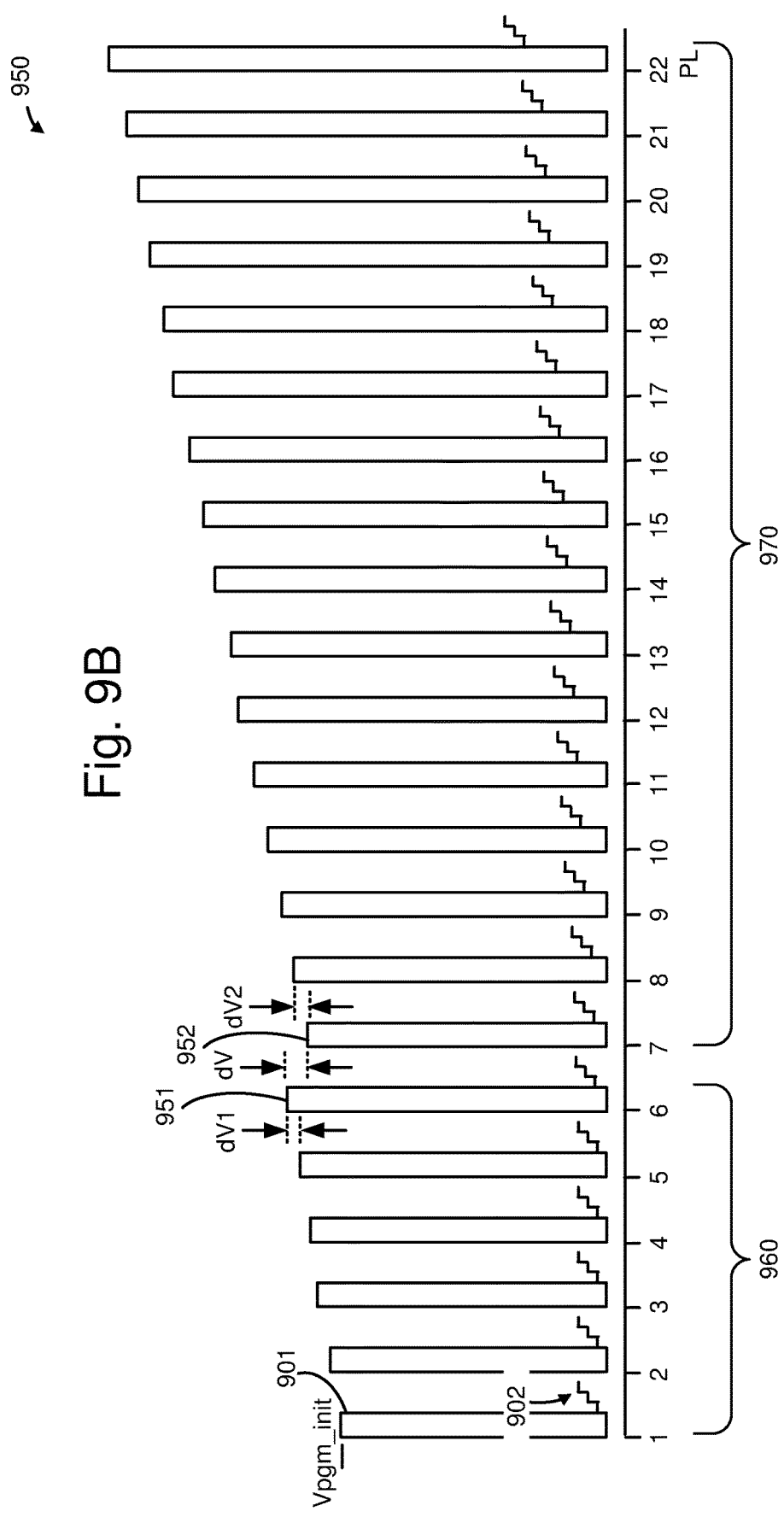
FIG. 9B depicts another voltage signal used in a series of program loops in an example program operation for the two planes of FIG. 8A, where the program voltage steps down after a bad block is detected.

FIG. 9B depicts another voltage signal used in a series of program loops in an example program operation for the two planes of FIG. 8A, where the program voltage steps down after a bad block is detected. The voltage signal 950 includes a first set of increasing program voltages 960 which are followed by a second set of increasing program voltages 970. The first set is applied to both the good and bad blocks. The second set is applied to the good block after determining that a concurrently programmed block is bad. Further, due to a step down in Vpgm which is triggered by a bad block detection, a first program voltage 952, in PL7, of the second set of increasing program voltages is lower than a last program voltage 951, in PL6, of the first set of increasing program voltages. The step size can be the same or different in the two sets of increasing program voltages. In this example, dV1 and dV2 are the step sizes in the first and second sets, respectively, of increasing program voltages. dV is a step down amount between the program voltages 951 and 952.

Assume a slowdown measure such as a positive bit line voltage is applied to memory cells with one or more lower assigned data states during each program voltage of the first set of increasing program voltages (see FIG. 9C), and that the slowdown measure is not applied to the memory cells with one or more lower assigned data states (or to memory cells of other assigned data states) during each program voltage of the second set of increasing program voltages. Further, assume the bad block is detected in PL6 so that the transition from the first to the second set of increasing program voltages occurs in the immediate next program loop, PL7.

Reducing the program voltage in PL7, when the slowdown measure is first removed, helps avoid a large increase in the Vth of the memory cells with the one or more lower assigned data states which are still being programmed, when the program voltage of PL7 is applied. This helps avoid a large overshoot of the Vth of these memory cells above the correct verify voltage, so that narrow Vth distributions can be achieved. The reduction in Vpgm could result in the program operation using one or more additional program loops compared to FIG. 9A, because the highest Vpgm level would be reached at a later PL. But, an advantage is achieved in that more of the memory cells with one or more lower assigned data states pass a verify test which does not use an upshifted verify voltage. That is, once the bad block is disconnected from the common voltage source, the pullup on the voltage signal is removed. See also FIG. 13E.

Figure 9C:
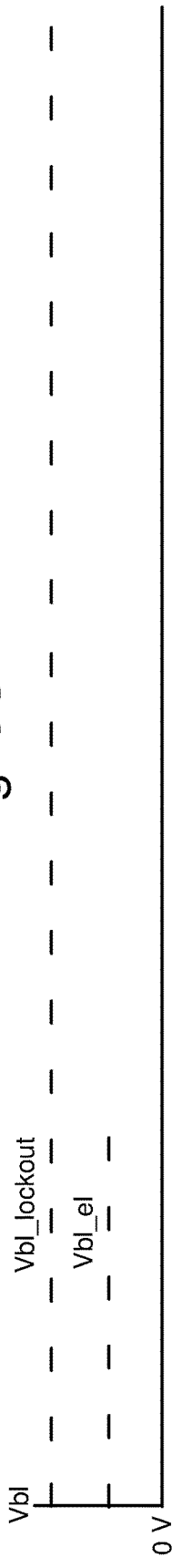
FIG. 9C depicts a plot of bit line voltages versus program loop number, consistent with FIG. 9B.

FIG. 9C depicts a plot of bit line voltages versus program loop number, consistent with FIG. 9B. The bit line voltage can be set separately for each memory cell in a set of memory cells selected for programming. As explained further in connection with FIG. 13E, a slowdown measure can be applied to a memory cell by setting the bit line voltage (Vbl) to a positive voltage such as Vbl_el, e.g., 1.0-1.5 V, which is below a lockout or inhibit level of Vbl_lockout, e.g., 2.5-3 V. By applying Vbl_el, the control gate-to-drain voltage of a memory cell is increased so that the programming is slowed down, compared to applying Vbl=0 V, a ground voltage. Vbl_el is applied to memory cells assigned to one or more lower data states, e.g., the A-C states, during a detection process for a bad block, and which have not completed programming. After the bad block detection process is completed, starting at PL7 in this example, 0 V is applied to the memory cells assigned to the one or more lower data states and which have not completed programming. In all the program loops, 0 V is applied to the memory cells assigned to the higher data states which have not completed programming, in one approach.

By applying Vbl_el in place of 0 V, the number of memory cells with the lower assigned data states which pass a verify test with an upshifted verify voltage is reduced. Instead, the majority of the memory cells with the lower assigned data states can instead pass a verify test with a non-upshifted verify voltage after the bad block is disconnected from the shared voltage source. Vbl_lockout is applied to a memory cell assigned to the erased state and to a memory cell which has passed the verify test of its assigned data state which is above the erased state. That is, Vbl_lockout is applied to a memory cell which has completed programming.

FIG. 10A depicts an example Vth distribution of sets of memory cells in a good block which completes a program operation. In FIG. 10A to 10C, the vertical axis depicts a number of memory cells, on a logarithmic scale, and the horizontal axis depicts a Vth of the memory cells on a linear scale. Eight data states are used, as an example. In one approach, at a start of the program operation, the memory cells are all initially in the erased state as represented by the Vth distribution 1000. After the program operation is successfully completed, the cells assigned to the Er state are represented by the Vth distribution 1008. The Vth distributions 1001-1007 which each represent memory cells assigned to one data state, are shown having a lower amplitude than the initial Vth distribution 1000, which encompasses all of the memory cells. In addition to the upshifted verify voltages due to a bad block, the Vth distributions may also be upshifted at the upper tail due to program disturb which occurs as the remaining memory cells are programmed.

The cells which are to be programmed to the A, B, C, D, E, F and G states using verify voltages of VvA, VvB, VvC, VvD, VvE, VvF and VvG, respectively, are represented by the Vth distributions 1001, 1002, 1003, 1004, 1005, 1006 and 1007, respectively. Read voltages VrA, VrB, VrC, VrD, VrE, VrF and VrG can be used for reading the states of the cells in a read operation. These verify voltages and read voltages are examples of control gate read levels of the selected word line voltage.

The erased state (represented by distribution 1000) is an assigned non-programmed data state and the A-F states (represented by distributions 1001-1007) are assigned programmed data states. The A state is the lowest assigned programmed data state because the A state has a threshold voltage that is lower in magnitude than the other assigned programmed data states (e.g. B-F). Further, in one example, the A-C states are lower assigned programmed data states and the D-F states are higher assigned programmed data states. As used herein, an assigned programmed data state is lower than another programmed data state if the assigned programmed data state covers a range of threshold voltage values that is lower than the range of threshold voltage values for the higher assigned programmed data state.

FIG. 10B depicts an example Vth distribution of a set of memory cells in a good block which is programmed concurrently with a bad block, where a Vth upshift is significant in the good block due to a late detection of the bad block. The upper tails of the Vth distributions of the memory cells with the lowest assigned programmed data states are increased more than for the memory cells with the highest assigned programmed data states, in one possible case. This is due to a greater pullup of the verify voltages for the lowest assigned programmed data states compared to the highest assigned programmed data states, as discussed. The increase in the upper tails is large enough to cause read errors due to the Vth distributions overlapping with a read voltage. Generally, the number of data states affected and the magnitude of the upshift of the upper tails in the good block is based on when the short circuit is detected in the bad block. When the bad block is detected sooner, the number of data states affected is reduced, and the magnitude of the upshift of the upper tails in the good block is reduced.

For example, the cells which are to be programmed to the A, B, C, D, E, F and G states are represented by the Vth distributions 1001a, 1002a, 1003a, 1004a, 1005, 1006 and 1007, respectively. In this example, we assume there is no increase in the Vth for the highest states, states E-G, so that the Vth distributions 1005, 1006 and 1007 are the same as in FIG. 10A, where there is no defect. The Vth distributions 1001a, 1002a, 1003a and 1004a include portions 1001b, 1002b, 1003b and 1004c, which are greater than the read voltages VrB, VrC, VrD and VrE, respectively. The memory cells with these Vth distributions will be read incorrectly as being in the next higher data state. The number of errors will be highest for the lowest assigned programmed data state, the A state.

The increase in the upper tail of the Vth distribution of the memory cells in FIG. 10B compared to FIG. 10A is depicted by the values Atu, Btu, Ctu and Dtu for the A, B, C and D states, respectively. As mentioned, these increases in the Vth distributions of a good block are caused by the pullup of the verify voltages due to a short circuit in a bad block which shares the same verify signal as the good block.

Note that the erased state Vth distribution in the good block could also be disturbed and upshifted beyond what is shown if the good block is not disconnected from the voltage source when it completes programming. In this case, high amplitude program voltages continue to be applied to all blocks to try to program the bad block, until a maximum allowed number of program loops is reached. The high amplitude program voltages can cause a disturb of the erased state memory cells, in particular.

FIG. 10C depicts an example Vth distribution of a set of memory cells in a good block which is programmed concurrently with a bad block, where a Vth upshift is minimal in the good block due to an early detection of the bad block. During the program loops in which the verify voltage is pulled up, e.g., before the bad block is detected, the memory cells in the good (and bad) blocks are subject to upshifted verify voltages of VvA_up, VvB_up, VvC_up and VvD_up, for the A, B, C and D states, respectively. The verify voltages for the E, F and G states are assumed to not be pulled up. During the program loops in which the verify voltage is not pulled up, e.g., after the bad block is detected, the memory cells in the good blocks are subject to the correct, non-pulled up verify voltages of VvA, VvB, VvC and VvD, for the A, B, C and D states, respectively.

In the Vth distributions 1001c, 1002c, 1003c and 1004c for the A, B, C and D states, respectively, some of the memory cells are locked out after passing a verify test using a pulled up verify voltage, while a majority of the memory cells are locked out after passing a verify test using a correct verify voltage. The Vth distributions for these lower assigned states indicate that the number of read errors will be significantly less compared to FIG. 10B using the fast failure detection technique as described herein.

Figure 11A:
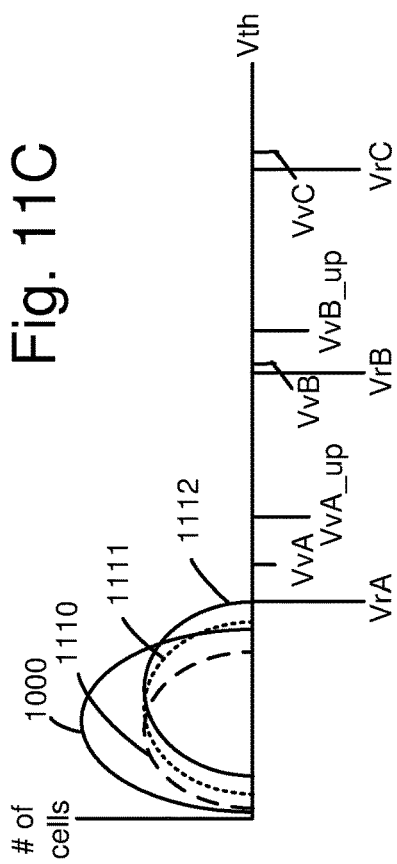
FIG. 11A depicts example Vth distributions in program loops 1-3 of memory cells in a good block which is affected by a bad block.

FIG. 11A depicts example Vth distributions in program loops 1-3 of memory cells in a good block which is affected by a bad block. FIG. 11A to 11D provide a plot of a number of memory cells versus Vth for the erased state up to the C state verify voltage, where the initial erased state Vth distribution 1000 of FIG. 10A to 10C is repeated. Vth distributions 1101, 1102 and 1103 are reached after PL1, PL2 and PL3, respectively. These Vth distributions represent all of the selected memory cells which are being programmed. The A-state verify test may be performed in each of these program loops, consistent with FIGS. 14A and 14B, using the pulled up voltage of VvA_up. In PL3, a portion 1103a at the leading edge or upper tail of the Vth distribution 1103 exceeds VvA_up. The associated memory cells will be sensed as being in a conductive state. When a predetermined number of memory cells in a first block pass the A-state verify test, e.g., a first verify test, this can trigger a process for comparing the program speed of the first block to the program speed of a second block. This comparison can involve determining whether the second block passes the first verify test within a specified number, e.g., three, of additional program loops.

The predetermined number of memory cells which must pass the verify test to trigger the program speed comparison with the bad block can be a minority of the memory cells which are subject to the verify test, e.g., less than 50%. In practice, it is desirable for this predetermined number or portion of memory cells to be fairly small, such as less than 1-5% of the memory cells which are subject to the verify test. In one approach, the predetermined number is based on 20 bits/1 KB sector range which is less than 1% of the memory cells which are subject to the verify test. A counting circuit represented by the cell counter 117 in FIG. 1 may obtain a count of the memory cells which pass the verify test. The counting circuit may have a limited capability as to how high it can count, so the predetermined number of memory cells should be within this capability. A smaller counting capacity allows for a simpler implementation. In one approach, in addition to triggering the program speed comparison, the counter can also be used to determine when programming of memory cells to an assigned data state is completed, consistent with FIG. 11E. Thus, the same counter can perform the count which triggers the defect detection process as well as determining when programming of memory cells to an assigned data state is completed.

Figure 11B:
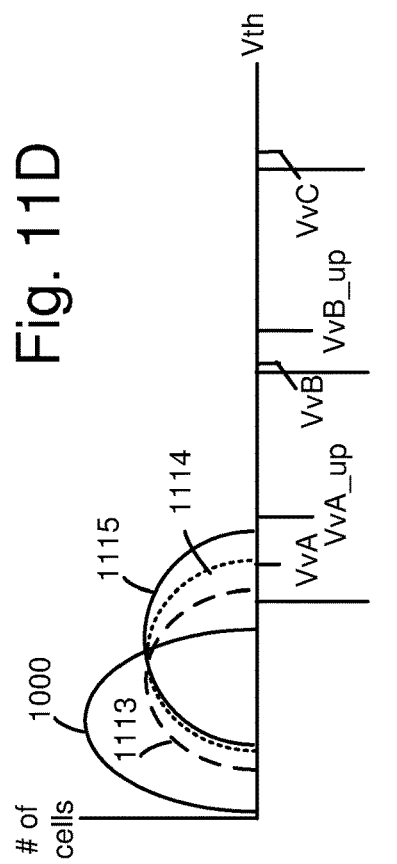
FIG. 11B depicts example Vth distributions in program loops 4-6 of memory cells in a good block which is affected by a bad block.

FIG. 11B depicts example Vth distributions in program loops 4-6 of memory cells in a good block which is affected by a bad block. Vth distributions 1104, 1105 and 1106 are reached after PL4, PL5 and PL6, respectively. These Vth distributions represent all of the selected memory cells which are being programmed. The A and B-state verify tests may be performed in PL4 while the A, B and C-state verify tests may be performed in PL5 and PL6, consistent with FIGS. 14A and 14B. These verify tests use the pullup voltages of VvA_up, VvB_up and VvC_up. Some of the A, B and C-state memory cells will pass their respective verify test in these program loops and be locked out from further programming.

Figure 11C:
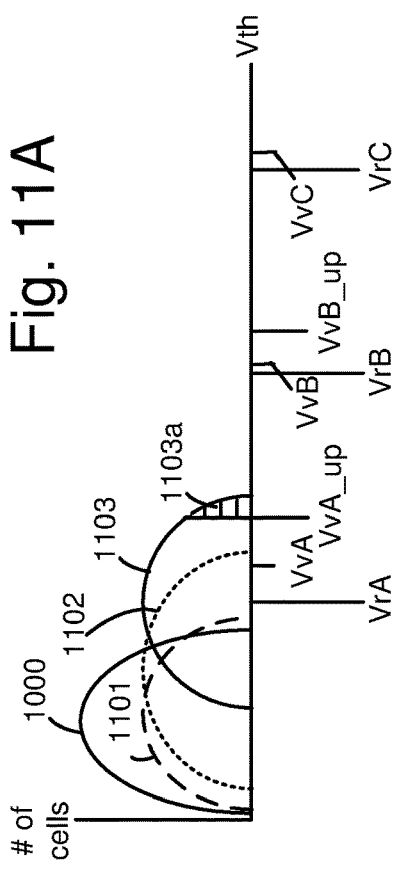
FIG. 11C depicts example Vth distributions in program loops 1-3 of memory cells in a bad block.

FIG. 11C depicts example Vth distributions in program loops 1-3 of memory cells in a bad block. Due to the short circuit in the bad block, the Vth of the selected memory cells cannot be increased at the normal rate. Vth distributions 1110, 1111 and 1112 are reached after PL1, PL2 and PL3, respectively. These Vth distributions represent all of the selected memory cells which are being programmed, and are well below the corresponding Vth distributions 1101-1103 of the good block. The A-state verify test may be performed in each of these program loops.

Figure 11D:
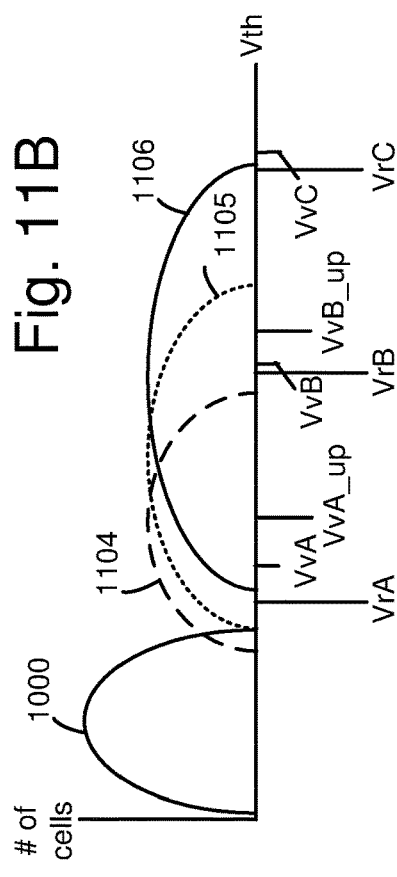
FIG. 11D depicts example Vth distributions in program loops 4-6 of memory cells in a bad block.

FIG. 11D depicts example Vth distributions in program loops 4-6 of memory cells in a bad block. Vth distributions 1113, 1114 and 1115 are reached after PL4, PL5 and PL6, respectively. These Vth distributions represent all of the selected memory cells which are being programmed, and are well below the corresponding Vth distributions 1104-1106 of the good block. The same verify tests may be performed for each program loop as in the good block, in one approach. The memory cells in the bad block do not meet the criterion of having a predetermined number of memory cells passing the first verify test by PL6. In fact, in this example, none of the memory cells have a Vth>VvA_up and therefore cannot pass the first verify test. That is, the number of memory cells which are in the conductive state when the A-state verify voltage is so small that a determination is made that the block is bad.

FIG. 11E depicts an example Vth distribution of memory cells in a good block which reach a lockout condition of an assigned data state, as an example of the late detection referred to in FIG. 10B. The vertical axis depicts a count of A-state memory cells and the horizontal axis depicts Vth. This approach detects a number of A-state memory cells which have not passed the A-state verify test. It therefore involves a detection of the lower tail of the Vth distribution instead of the upper tail. The Vth distribution 1120 includes a portion 1120a which represents the memory cells with Vth<VvA_up. These cells are sensed as being in a non-conductive state. When a count of these memory cells is less than a predetermined number of memory cells, this can trigger a process for comparing the program speed of the first block to the program speed of a second block. This comparison can involve determining whether, in the second block, a count of A-state memory cells which do not pass the verify test within a specified number of additional program loops, is less than the predetermined number of memory cells. This approach consumes additional program loops before a bad block can be detected, compared to the approach of FIG. 11F, because it depends on counting the slowest programming memory cells.

As an example, the comparison process might be triggered at PL9 using the approach of FIG. 11E compared to PL3 using the approach of FIG. 11F. The corresponding detection of a bad block might be triggered at PL12 using the approach of FIG. 11E compared to PL6 using the approach of FIG. 11F—a difference of six program loops.

FIG. 11F depicts the Vth distribution 1103 of FIG. 10A, showing fastest-programming memory cells and slowest-programming memory cells in a good block after PL3. The vertical axis depicts a count of memory cells and the horizontal axis depicts Vth. The Vth distribution 1103 and the portion 1103a of FIG. 11A are repeated. The Vth distribution represents a set of memory cells which are subject to the A-state verify test. This can include the memory cells assigned to the A-state and/or other higher states. A line 1103b represents a midpoint of the Vth distribution 1103 such that a portion 1103c of the Vth distribution represents slowest-programming memory cells among the memory cells which are subject to the verify test and the portion 1103d of the Vth distribution represents fastest-programming memory cells among the memory cells which are subject to the verify test. As mentioned, by detecting the fastest-programming memory cells in a good block, a comparison of programming speed with another block can be initiated sooner in the program operation. A bad block can therefore detected sooner and disconnected from the common voltage source, so that the programming of the good block can continue sooner without the voltage pullup.

Thus, the good block will be subject to the voltage pullup for fewer program loops in a program operation.

This approach detects a number of memory cells which have passed the A-state verify test. It therefore involves a detection of the upper tail or leading edge of the Vth distribution instead of the lower tail. The Vth distribution 1103 includes a portion 1103a which represents the memory cells with Vth>VvA_up. These cells are sensed as being in a conductive state. When a count of these memory cells is more than a predetermined number of memory cells, this can trigger a process for comparing the program speed of the first block to the program speed of a second block. This comparison can involve determining whether, in the second block, a count of A-state memory cells which do not pass the verify test within a specified number of additional program loops, is more than the predetermined number of memory cells.

FIG. 11G depicts the Vth distribution 1115 of FIG. 11D, showing fastest-programming memory cells and slowest-programming memory cells in a bad block after PL6. The vertical axis depicts a count of memory cells and the horizontal axis depicts Vth. The Vth distribution 1115 of FIG. 11D is repeated. The Vth distribution represents a set of memory cells which are subject to the A-state verify test. A line 1115a represents a midpoint of the Vth distribution 1115 such that a portion 1115b of the Vth distribution represents slowest-programming memory cells among the memory cells which are subject to the verify test and the portion 1115c of the Vth distribution represents fastest-programming memory cells among the memory cells which are subject to the verify test. In this example, none of the memory cells in the bad block pass the verify test because their Vth is less than VvA_up.

FIG. 12 depicts a plot showing an upshift in the upper tail of a Vth distribution for memory cells in a good block versus a program loop at which a bad block is detected, in a concurrent programming operation. Generally, the upshift is relatively greater when the bad block is detected later in the program operation, e.g. at a relatively higher program loop number. This is because a relatively larger number of memory cells pass the verify test and are locked out from further programming at an upshifted verify voltage, which is higher than the correct verify voltage. Moreover, the upshift is relatively greater for memory cells with relatively lower assigned data states. The plots 1200, 1201, 1202 and 1203 represent the Vth upshift for the A, B, C and D states, respectively. Examples of the upshift were provided in FIG. 10B as Atu, Btu, Ctu and Dtu for the A, B, C and D states, respectively.

In this example, the A, B, C and state memory cells complete programming at PL9, PL12, PL14 and PL16, respectively, consistent with FIG. 14A. In previous examples, a program speed comparison was triggered at PL3 at a faster block and a conclusion of whether a slower block is defective was made in PL6. The upshift of the A-D states is minimal in this example, where a defective block is detected at PL6. However, if the bad block is detected later, such as at PL8, the upshift in the upper tail of the Vth distribution for the A state memory cells (but not for the B-D state memory cells) is significant. If the bad block is detected at PL10, the upshift in the upper tail of the Vth distribution for the A and B state memory cells (but not for the C and D state memory cells) is significant. If the bad block is detected after PL10, the upper tail of the Vth distribution for the A-D state memory cells is significant. This demonstrates why a bad block should be detected at the lowest possible program loop number.

Figure 13A:
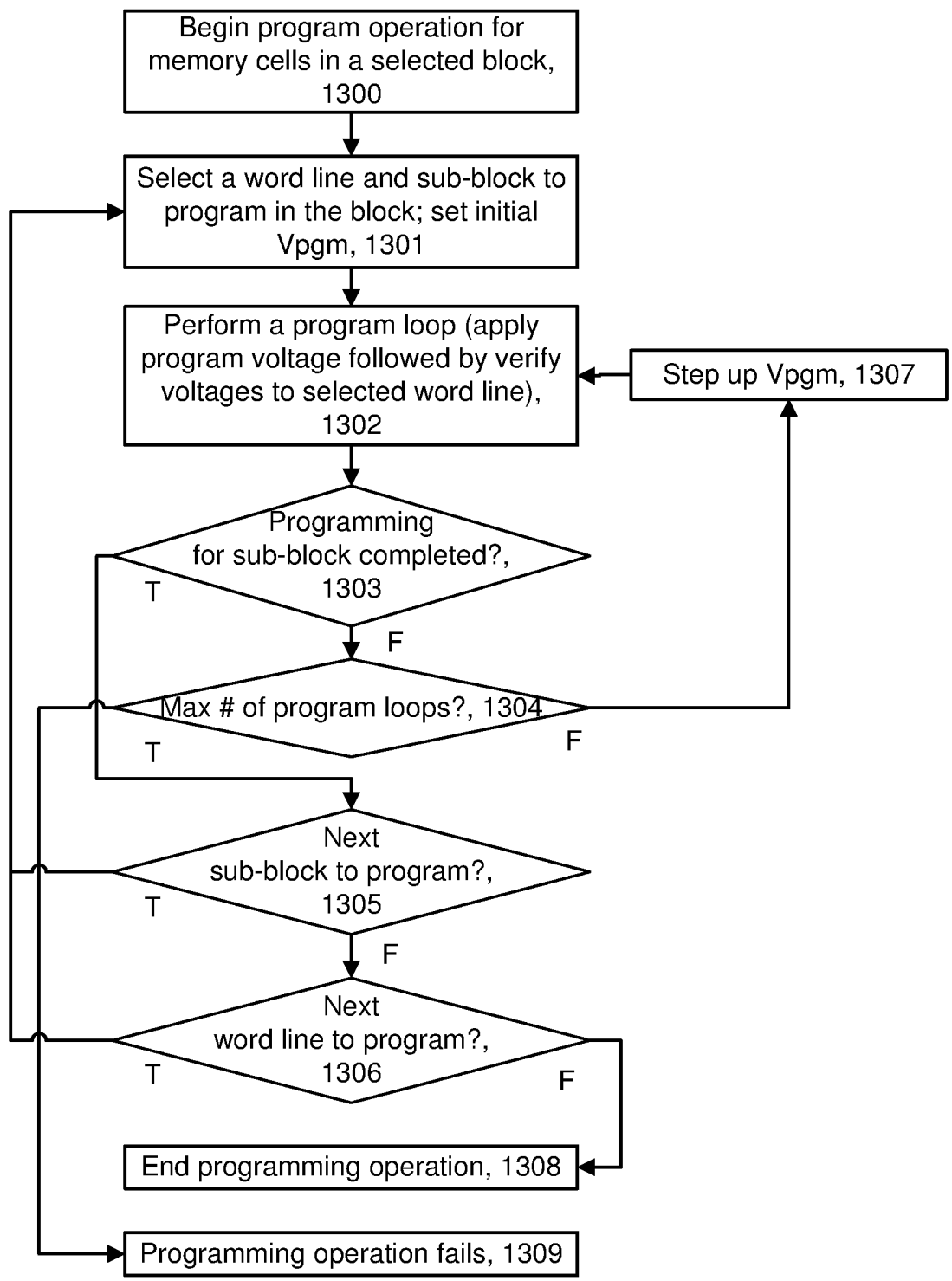
FIG. 13A depicts a flowchart of an example programming operation for a block.

FIG. 13A depicts a flowchart of an example programming operation for a block. Step 1300 begins a program operation for memory cells in a selected block. Step 1301 selects a word line and sub-block to program in the block, and sets an initial program voltage (Vpgm). See, e.g., FIG. 9A and Vpgm_init. Step 1302 performs a program loop by applying a program voltage followed by verify voltages to the selected word line. See FIG. 9A. While the program voltage is applied to the selected word line, a pass voltage is applied to the unselected word lines. Also, a program or inhibit status is set for the memory cells connected to the selected word line. A memory cell with an inhibit status has the associated bit line of the memory string set to a high level, e.g., 2-3 V which inhibits programming. A memory cell with a program status has the associated bit line of the memory string set to a low level, e.g., 0 V, which allows programming. The verify tests involve applying a voltage at one or more control gate read levels to the selected memory cells via the selected word line while applying a voltage at a read pass level to the unselected word lines while sensing the memory cells. The sensing of a memory cell can involve detecting a level of a current in the associated memory string. The verify test determines whether each selected memory cell is in a conductive or non-conductive state.

At a decision step 1303, if programming is completed for the sub-block, and at decision step 1305, there is a next sub-block of the word line to program, step 1301 is repeated by selecting memory cells of the selected word line in a next sub-block. The programming may be completed for a sub-block when all, or nearly all of the memory cells reach the lockout state. If there is not a next sub-block to program, and there is a next word line to program at decision step 1306, step 1301 is repeated by selecting memory cells of a next selected word line. If there is not a next word line to program, the program operation ends at step 1308. If the maximum number of program loops is reached at decision step 1304, the program operation fails at step 1309. If the maximum number of program loops is not reached at decision step 1304, step 1307 steps up Vpgm and step 1302 is repeated.

FIG. 13B depicts a flowchart of an example concurrent programming operation for multiple blocks, where a bad block is detected based on a programming speed difference among the blocks. Step 1310 begins concurrent program operations for memory cells in different blocks using common program voltage and verify voltage signals in successive program loops. In one option, step 1311 indicates that a program milestone is reached by a fast block (e.g., a fast-programming block) before one or more slow blocks (e.g., a slow-programming block). After the milestone is reached, step 1313 continues the program operation for the fast and slow blocks in a specified number of additional program loops (PLs). The milestone can involve a predetermined number of memory cells passing a verify test, for example. At a decision step 1313, if a slow block reaches the program milestone within the specified number of additional PLs, the slow block is not considered to be defective, and the program operation is completed for all blocks at step 1314. If the decision step 1313 is false, the slow block is considered to be defective, and step 1317 terminates the program operation for the slow block and continues the program operation for the fast block. Steps 1313 and 1317 can be performed for each of one or more slow blocks.

In another option, step 1315 indicates that the program milestone is reached by all blocks in the same PL. In this case, no comparison is made of program speed among the blocks and no blocks are considered to be defective. Step 1316 continues the program operation for all blocks.

FIG. 13C depicts a flowchart of an example concurrent programming operation for multiple blocks, where a bad block is detected based on a programming speed difference among the blocks for fastest-programming memory cells. Step 1320 begins concurrent program operations for memory cells in first and second blocks using common program voltage and verify voltage signals in successive program loops. Step 1321 detects a program loop, referred to as a reference program loop (PLref1), in which a first verify test is passed by a predetermined number of fastest-programming memory cells in the first block. These are the fastest-programming memory cells among the memory cells in the first block which are subject to the first verify test, in one approach. See FIG. 11F.

At decision step 1322, if a predetermined number of the fastest-programming memory cells in the second block pass the first verify test within a first number of PLs, e.g., one or more PLs, after PLref1, the program operation continues for all blocks at step 1323. These are the fastest-programming memory cells among the memory cells in the second block which are subject to the first verify test. See FIG. 11F. The (first) predetermined number of step 1321 can be the same as, or different than, the (second) predetermined number of step 1322.

If the decision step 1322 is false, step 1324 terminates the program operation for the second block and continues the program operation for the first block. Step 1322a notes that the first number of PLs can be a function of PLref1, the reference program loop. See FIG. 15 for further details. In one option, the first number of PLs is an increasing function of PLref1. This is appropriate, e.g., to accommodate an expected wider divergence in programming progress for fast and slow blocks as the number of program loops increases. In another option, the first number of PLs is a decreasing function of PLref1. For example, the slow block may exhibit a slow down particularly for the higher data states, such as the G state, where there is a likelihood that this leads to many high magnitude program pulses in an attempt to complete programming. The high magnitude program pulses can cause problems such as stressing the memory cells and increasing program disturb. A reduced margin for higher data states, and higher program loops, can therefore be appropriate to limit the number of high magnitude program pulses.

Note that the same first verify test which is normally used to verify memory cells relative to their assigned data state can be used to decide when to trigger a process to detect a defective block based on a program speed difference. As a result, there is no time penalty. Alternatively, the first verify test can be separate from those used to verify memory cells relative to their assigned data state. For example, the verify test could use a voltage which is lower than VvA, the verify voltage of the lowest programmed data state. This would allow the decision to trigger the defect detection process, and the decision of whether a defect exists, to occur sooner. For example, VrA in FIG. 10A-10C could be the verify voltage of the first verify test.

Figure 13D:
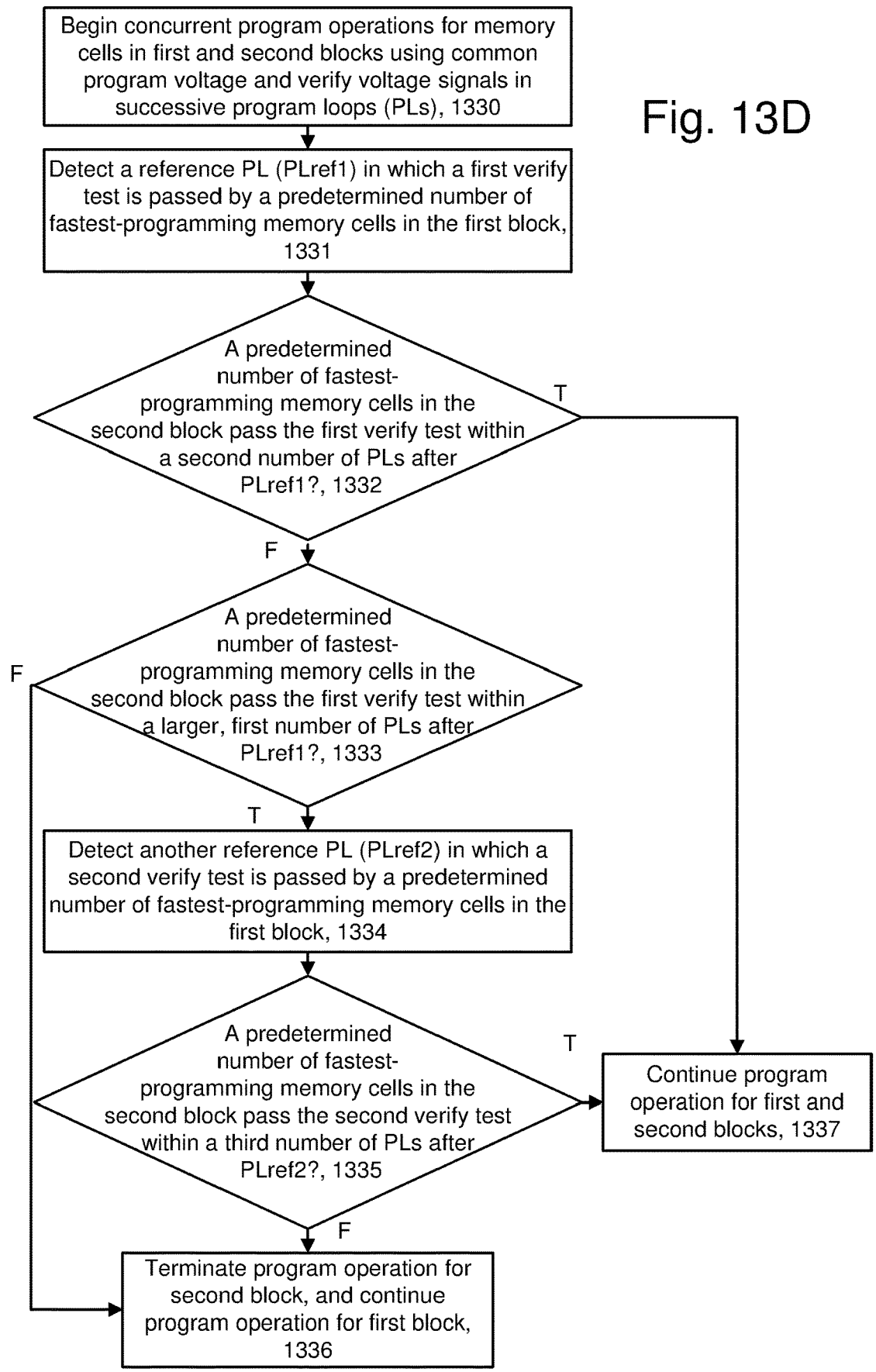
FIG. 13D depicts a flowchart of another example concurrent programming operation for multiple blocks, where a bad block is detected based on a programming speed difference among the blocks for fastest-programming memory cells.

FIG. 13D depicts a flowchart of another example concurrent programming operation for multiple blocks, where a bad block is detected based on a programming speed difference among the blocks for fastest-programming memory cells. Step 1330 begins concurrent program operations for memory cells in first and second blocks using common program voltage and verify voltage signals in successive program loops. Step 1331 detects a reference PL (PLref1) in which a first verify test is passed by a predetermined number of fastest-programming memory cells in the first block. These are the fastest-programming memory cells among the memory cells in the first block which are subject to the first verify test, in one approach. At decision step 1332, if a predetermined number of fastest-programming memory cells in the second block pass the first verify test within a second number of PLs, e.g., one or more PLs, after PLref1, the program operation continues for the first and second blocks at step 1337. These are the fastest-programming memory cells among the memory cells in the second block which are subject to the first verify test. If decision step 1332 is false and, at decision step 1333, if a predetermined number of fastest-programming memory cells in the second block pass the first verify test within a larger, first number of PLs after PLref1, step 1334 detects another reference program loop (PLref2), in which a second verify test is passed by a predetermined number of fastest-programming memory cells in the first block. These are the fastest-programming memory cells among the memory cells in the first block which are subject to the second verify test.

The first verify test can be a verify test of a first assigned programmed data state which uses a first verify voltage, and the second verify test can be a verify test of a second assigned programmed data state which uses a second verify voltage, higher than the first verify voltage. In one example, the first and second verify tests use the verify voltages of the A and C state, respectively. The first and second verify tests can be performed in the normal course of a program operation, along with other verify tests, such as according to the chart of FIG. 14A. As a result, there is no time penalty in performing extra verify tests to detect a defective block.

If at decision step 1335, a predetermined number of fastest-programming memory cells in the second block pass the second verify test within a third number (a specified number) of PLs after PLref2, the program operation continues for the first and second blocks at step 1337. These are the fastest-programming memory cells among the memory cells in the second block which are subject to the second verify test. If decision step 1335 is false, step 1336 terminates the program operation for the second block and continues the program operation for the first block. Step 1336 is also reached if decision step 1333 is false.

This approach decides whether to perform another detection of a possibly bad block (at steps 1334 and 1335) based on the result from an initial detection of program speed (at steps 1332 and 1333) using two different criterion. Further, the initial detection distinguishes between three different scenarios. In a first scenario, the program speed of the second block is slightly slower but close to the program speed of the first block. For example, assume PLref1 in step 1331 is PL3, that the second number of PLs is one and the first number of PLs is three. In the first scenario, the second block passes the first verify test one program loop after PL3, i.e., in PL4.

In a second scenario, the program speed of the second block is somewhat slower than the program speed of the first block but not so slow that the second block is declared to be defective. For example, the second block may pass the first verify test two or three program loops after PL3, i.e., in PL5 or PL6, respectively. In a third scenario, the program speed of the second block is so slow that the second block is declared to be defective. For example, the second block may not pass the first verify within three program loops after PL3, i.e., at PL6.

The another detection is performed in response to the second scenario, where there may still be a question as to whether the second block is defective. This approach provides a second check of the programming speed of a block when warranted.

The predetermined numbers of steps 1331-1335 can be the same as one another, or different.

Figure 13E:
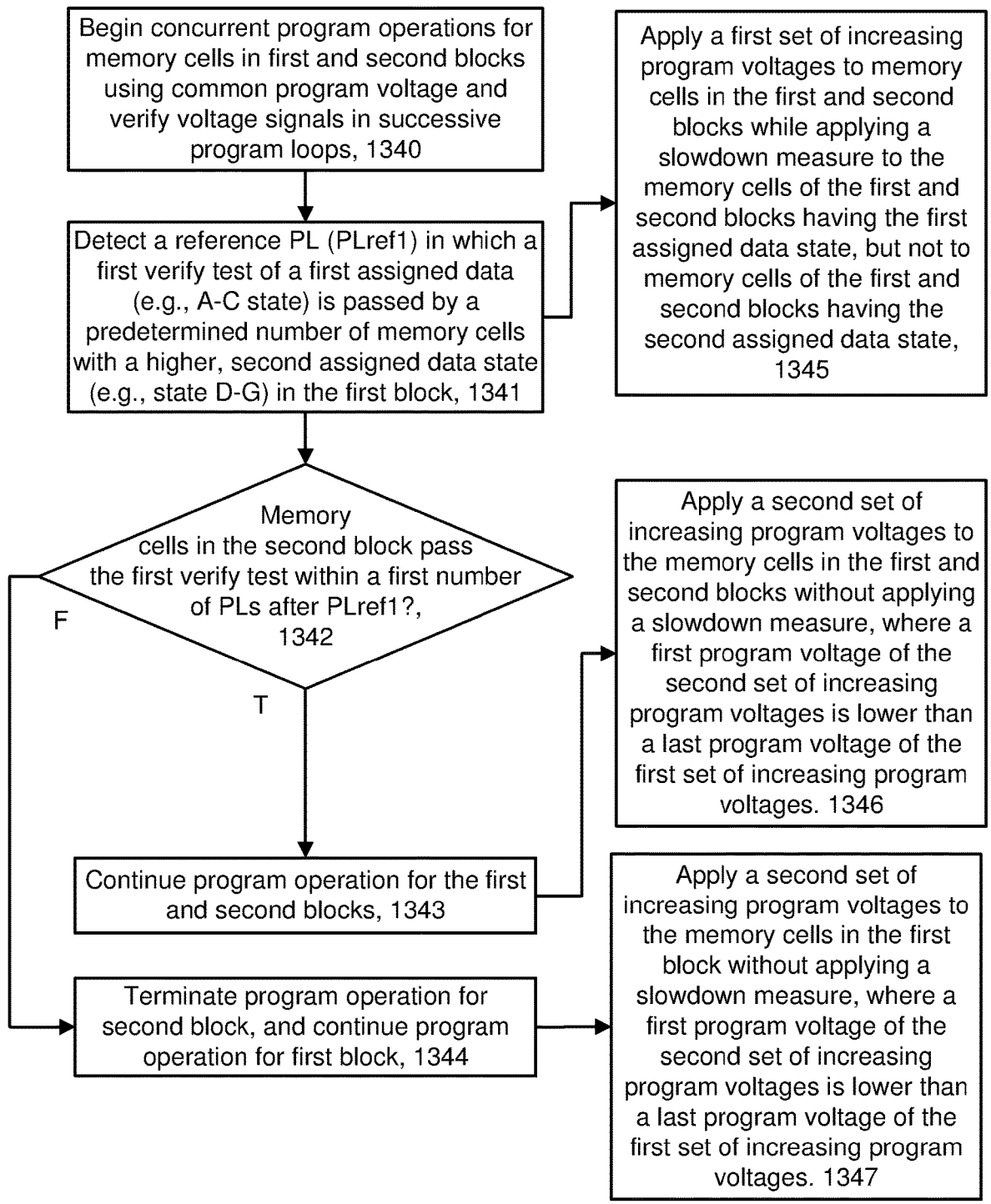
FIG. 13E depicts a flowchart of another example concurrent programming operation for multiple blocks, where a bad block is detected based on a programming speed difference among the blocks for fastest-programming memory cells, and where a slowdown measure is applied to memory cells with a lower assigned data state during the detection.

FIG. 13E depicts a flowchart of another example concurrent programming operation for multiple blocks, where a bad block is detected based on a programming speed difference among the blocks for fastest-programming memory cells, and where a slowdown measure is applied to memory cells with a lower assigned data state during the detection. Step 1340 begins concurrent program operations for memory cells in first and second blocks using common program voltage and verify voltage signals in successive program loops. Step 1341 detects a reference PL (PLref1) in which a first verify test of a first assigned programmed data state (e.g., one of the A-C states) is passed by memory cells with a higher, second assigned programmed data state (e.g., one of states D-G) in the first block. Step 1341 could involve detecting when the fastest-programming memory cells pass the first verify test, among the memory cells in the first block which are subject to the first verify test. Step 1345 indicates that step 1341 can include applying a first set of increasing program voltages to memory cells in the first and second blocks while applying a slowdown measure to the memory cells of the first and second blocks having the first assigned programmed data state, but not to memory cells of the first and second blocks having the second assigned programmed data state, consistent with FIGS. 9B and 9C.

At decision step 1342, if the memory cells in the second block pass the first verify test within a first number of PLs after PLref1, the program operation continues for the first and second blocks at step 1343. Step 1342 could involve detecting when the fastest-programming memory cells pass the first verify test, among the memory cells in the second block which are subject to the first verify test. Step 1346 indicates that step 1343 can include applying a second set of increasing program voltages to the memory cells in the first and second blocks without applying a slowdown measure, where a first program voltage of the second set of increasing program voltages is lower than a last program voltage of the first set of increasing program voltages, consistent with FIGS. 9B and 9C.

If decision step 1342 is false, step 1344 terminates the program operation for the second block and continues the program operation for the first block. Step 1347 indicates that step 1344 can include applying a second set of increasing program voltages to the memory cells in the first block without applying a slowdown measure, where a first program voltage of the second set of increasing program voltages is lower than a last program voltage of the first set of increasing program voltages, consistent with FIGS. 9B and 9C.

Note that the example processes which refer to concurrent programming of two blocks can be extended to encompass more than two blocks. Generally, the block which first reaches a program milestone, such as passing a verify test, is used as a baseline to evaluate the program speed of each of the remaining blocks. In FIG. 13C-13E, the steps involving the second block can be applied to each of the slower blocks, so that one or more of the slower blocks can be identified as being defective. Moreover, the processes of FIG. 13C-13E can be performed for each block, where the first block is the block for which the process is performed and the second block is one or more other blocks.

FIG. 14A depicts a table showing which verify tests are performed in which program loop in an example program operation consistent with FIG. 9A. The table is consistent with FIG. 9A. The program loop number is depicted in the left hand column and the verify voltages are depicted in the top row. In the other rows, a data state is depicted at the intersection of some of the rows and a column. This indicates which memory cells are subject to a verify test. For example, in PL1, the memory cells assigned to the A state are subject to a verify test using VvA. VvA is the voltage output by the voltage source but it may be pulled up to a higher level, VvA_up, if there is a defective block. The remaining program loops and the memory cells which are subject to the verify test of their respective assigned data state are: PL2: A, PL3 and PL4: A, B, PL5 and PL6: A-C, PL7 and PL8: A-D, PL9: A-E, PL10: B-E, PL11 and PL12: B-F, PL13 and PL14: C-G, PL15 and PL16: D-G, PL17 and PL18: E-G, PL19 and PL20: F and G, and PL21 and PL22: G. The verify tests progress from the lower states to the higher states as the program operation proceeds.

In one approach, the verify tests which are performed for each program loop are predetermined, e.g., set before the program operation. In another approach, the verify tests which are performed for some program loops are determined adaptively during the program operation, based on the programming progress. For example, assume that the A-state memory cells (memory cells assigned to one data state) pass a first verify test at PL3, consistent with FIG. 13C, step 1321. A rule can be set to begin the verify tests for the C-state memory cells (memory cells assigned to another data state) two program loops later, e.g., at PL5. The first verify test in a first block can therefore be used for two functions: one is to trigger the defect check for another block, and another is to determine when to perform a verify test in the first block for another data state.

FIG. 14B depicts another table showing which verify tests are performed in which program loop in an example program operation consistent with FIGS. 9B and 9C, where a slowdown measure is applied to memory cells with one or more lower assigned data states during a bad block detection process. The slowdown measure is applied to the A-C state memory cells in PL1-PL6. Consistent with a previous example, a first block passes a verify test consistent with FIG. 13C, step 1321 at PL3 (PLref1), and a determination is made as to whether a second block passes the first verify test within a first number, e.g., three, of PLs after PLref1 (e.g., in PL4-PL6).

FIG. 14B differs from FIG. 14A in that a verify test of one assigned data state, e.g., the A state, is performed for memory cells assigned to another data state, e.g., the G state, in PL1 and PL2. Additionally, the verify test of the A state is also performed on memory cells assigned to both the A and G states in PL3-PL6. Thus, the detection of FIG. 13E, step 1341 can be based on the G-state memory cells instead of the A-state memory cells. This is because the A-state memory cells are subject to a slowdown measure and the G-state memory cells are not subject to a slowdown measure. Starting at PL7, only the A state memory cells are subject to the A state verify test. In this case, PL7 is the first PL after the bad block is identified at PL6.

The B and C-state memory cells can also be subject to the slowdown measure from PL1-PL6 since the majority of these memory cells do not reach the lockout state until after PL6. As an alternative to verifying the G-state memory cells in PL1-PL6, the D, E and/or F state memory cells could alternatively be verified since these also are not subject to the slowdown measure.

The program loops and the memory cells which are subject to a verify test are: PL1 and PL2: G, PL3 and PL4:

A, B and G, PL5 and PL6: A-C and G, PL7 and PL8: A-D, PL9 and PL10: A-E, PL11: A-F, PL12: B-F, PL13 and PL14: B-G, PL15: C-G, P16 and PL17: D-G, PL18 and PL19: E-G, PL20 and PL21: F and G, and PL22: G. Compared to FIG. 14A, the verify tests for the A, B, C, D, E and F states continue until PL11, PL14, PL15, PL17, PL19 and PL21 instead of PL9, PL12, PL14, PL16, PL18 and PL20, respectively, due to the slowdown measure and/or the step down in the program voltage as discussed in connection with FIGS. 9B and 9C. One or more additional program loops may also be used to complete programming of the F state memory cells in FIG. 14B compared to FIG. 14A although the same number of program loops (22) is depicted for simplicity.

Figure 15:
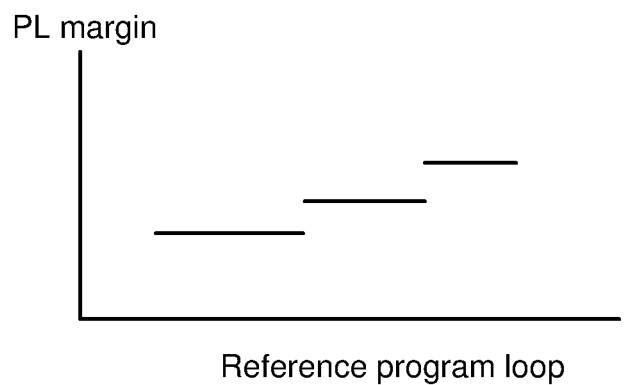
FIG. 15 depicts a plot of a program loop margin as an increasing function of a reference program loop in which a verify test is passed, consistent with step 1322a of FIG. 13C.

FIG. 15 depicts a plot of a program loop margin as an increasing function of a reference program loop in which a verify test (e.g., a first and/or second verify test) is passed, consistent with step 1322a of FIG. 13C. The program loop margin is the number of program loops which are used to determine if a slower programming block is defective, after a faster programming block reaches a programming milestone such as passing a first verify test. Generally, good blocks should have a similar programming speed so that any significant difference in program speed indicates the presence of a defect. Once approach is to set the program loop margin to a fixed level such a three program loops. Another approach is to set the program loop margin adaptively, based on the PL loop in which the first verify test is passed. When this PL loop number is relatively high, the margin can be relatively high since a given program speed difference between blocks will result in more noticeable differences in reaching program milestones as the program operation proceeds. This approach results in determining a program speed difference as a function of the PL loop number and adjusts for changes to program speed which may occur as the blocks are cycled.

For example, program speed may increase as the blocks are cycled. For a fresh block, the PL loop in which the first verify test is passed may be relatively high, e.g., PL6, in which case a larger margin of four loops may be appropriate. For a cycled block, the PL loop in which the first verify test is passed may be relatively low, e.g., PL3, in which case a smaller margin of three loops may be appropriate.

Further, this approach automatically accounts for different program speeds which can be associated with different word lines in a stack based on variations in the memory hole diameter. See FIG. 6B. For example, at the bottom of the stack, the memory hole diameter is relatively small so that the programming speed is relatively fast. The reference program loop is expected to be relatively lower so that the program loop margin can be set to be relatively lower, compared to memory cells at the top of the stack, where the memory hole diameter is relatively large so that the programming speed is relatively slow. In this case, the reference program loop is expected to be relatively higher so that the program loop margin can be set to be relatively higher. This helps to optimize the detection process.

Further, this approach automatically accounts for other factors which might affect program speeds such as fabrication variations and environmental factors such as temperature.

In one implementation, an apparatus comprises: a first block of memory cells; a second block of memory cells; and a control circuit, the control circuit configured to concurrently program the first block and the second block and to detect during the concurrent programming whether a defect exists in the second block, the control circuit to detect the defect is configured to: subject memory cells in the first block to a first verify test; determine a reference program loop in which a predetermined number of memory cells in the first block pass the first verify test; subject memory cells in the second block to the first verify test; and determine whether a predetermined number of memory cells in the second block pass the first verify test within a first number of program loops after the reference program loop.

In another implementation, a method comprises: beginning a program operation concurrently for a first set of memory cells and a second set of memory cells, the first set of memory cells comprises first memory cells assigned to one data state, the second set of memory cells comprises second memory cells assigned to the one data state, the program operation comprises successive program loops in which a program voltage is applied to, and a verify test is performed for, the first memory cells and the second memory cells; determining a reference program loop of the successive program loops in which a predetermined number or portion of the first memory cells passes the verify test; determining whether a predetermined number or portion of the second memory cells pass the verify test within a specified number of additional program loops of the successive program loops, wherein the predetermined number or portion of the first memory cells is less than half of the first memory cells; and in response to determining that the predetermined number or portion of the second memory cells do not pass the verify test within the specified number of additional program loops, terminating the program operation for the second set of memory cells and continuing the program operation for the first set of memory cells.

In another implementation, an apparatus comprises: means for identifying a reference program loop of successive program loops of a program operation in which a number of memory cells in a first block which pass a verify test exceeds a predetermined number of memory cells; means for determining that a number of memory cells in a second block which pass the verify test does not exceed the predetermined number of memory cells within a specified number of additional program loops after the reference program loop, wherein the specified number of additional program loops is a function of the reference program loop; and means for terminating the program operation for the second block based on the means for determining.

The means for identifying and the means for determining may include the sense blocks 51-53, the control circuitry 110 and the controller 122 of FIG. 1, or other logic hardware, and/or other executable code stored on a computer readable storage medium or device. Other embodiments may include similar or equivalent means.

The means for terminating may include the control circuitry 110 and the controller 122 of FIG. 1, the switches SW0a-SW0d and SW1a-SW1d of FIG. 8A, or other logic hardware, and/or other executable code stored on a computer readable storage medium or device. Other embodiments may include similar or equivalent means.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
memory cells in a first block, the memory cells in the first block are connected to a selected word line;
memory cells in a second block, the memory cells in the second block are connected to a selected word line; and
a control circuit, the control circuit configured to concurrently program the memory cells in the first block and the memory cells in the second block and to detect during the concurrent programming whether a defect exists in the second block, the control circuit to detect the defect is configured to:
subject the memory cells in the first block to a first verify test;
determine a reference program loop in which a predetermined number of the memory cells in the first block pass the first verify test;
subject the memory cells in the second block to the first verify test; and
determine whether a predetermined number of the memory cells in the second block pass the first verify test within a first number of program loops after the reference program loop.

2. The apparatus of claim 1, further comprising:
a voltage source configured to provide a voltage signal which is shared by the selected word line of the first block and the selected word line of the second block during the concurrent programming, the voltage signal comprises a verify voltage of a lowest assigned programmed data state among a plurality of assigned programmed data states.

3. The apparatus of claim 2, wherein:
the predetermined number of the memory cells in the first block are assigned to the lowest assigned programmed data state and comprise fastest-programming memory cells among memory cells in the first block which are assigned to the lowest assigned programmed data state.

4. The apparatus of claim 1, wherein:
in response to detecting that the predetermined number of the memory cells pass the first verify test within the first number of program loops after the reference program loop, the control circuit is configured to make another detection during the concurrent programming of whether the defect exists in the second block; and
the control circuit to make the another detection is configured to:
subject the memory cells in the first block to a second verify test;
determine a second program loop in which the second verify test is passed by a predetermined number of the memory cells in the first block;
subject the memory cells in the second block to the second verify test; and
determine whether the second verify test is passed by a predetermined number of the memory cells in the second block within a specified number of additional program loops after the second program loop.

5. The apparatus of claim 4, wherein:
the specified number of additional program loops is different than the second number of program loops.

6. The apparatus of claim 1, wherein:
in response to the detection indicating that the first verify test is passed by the predetermined number of the memory cells in the second block within the first number of program loops, but not within a second number of program loops, after the reference program loop, where the second number is less than the first number, the control circuit is configured to make another detection during the concurrent programming of whether the defect exists in the second block; and
the control circuit to make the another detection is configured to:
subject the memory cells in the first block to a second verify test; and
determine a second program loop in which the second verify test is passed by a predetermined number of the memory cells in the first block;
subject memory cells in the second block to the second verify test; and
determine whether the second verify test is passed by a predetermined number of the memory cells in the second block within an additional number of program loops after the second program loop.

7. The apparatus of claim 1, wherein:
in response to the detection indicating that the first verify test is passed by the predetermined number of the memory cells in the second block within the first number of program loops, but not within a second number of program loops, after the reference program loop, the control circuit is configured to make another detection during the concurrent programming of whether the defect exists in the second block; and
in response to the detection indicating that the first verify test is passed by the predetermined number of the memory cells in the second block within the first number of program loops and within the second number of program loops after the reference program loop, the control circuit is configured to complete the concurrent programming without another detection of whether the defect exists in the second block.

8. The apparatus of claim 1, wherein:
in response to the detection indicating that the defect exists in the second block, the control circuit is configured to continue programming of the memory cells in the first block and to terminate programming of the memory cells in the second block.

9. The apparatus of claim 1, further comprising:
a voltage source configured to provide a voltage signal which is shared by the selected word line of the first block and the selected word line of the second block during the concurrent programming; and
a switch between the second block and the voltage source, wherein the control circuit is configured to set the switch in a non-conductive state to block the voltage signal from reaching the second block, in response the detection indicating that the defect exists in the second block.

10. The apparatus of claim 1, wherein:
the control circuit to determine the reference program loop, is configured to detect an upper tail of a threshold voltage distribution of the memory cells in the first block; and
the control circuit to determine whether the first verify test is passed by the predetermined number of the memory cells in the second block within the first number of program loops after the reference program loop, is configured to detect an upper tail of a threshold voltage distribution of the memory cells in the second block.

11. The apparatus of claim 1, wherein:
the first number of program loops is a function of the reference program loop.

12. The apparatus of claim 1, wherein:
the memory cells in the first block comprise memory cells with a first assigned programmed data state and memory cells with a second assigned programmed data state which is higher than the first assigned programmed data state;

the first verify test is for the first assigned programmed data state;

the predetermined number of the memory cells in the first block comprise memory cells with the second assigned programmed data state; and during program voltages applied to the selected word line of the first block in the concurrent programming, the control circuit is configured to apply a slowdown measure for the memory cells with the first assigned programmed data state but not for the memory cells with the second assigned programmed data state before the detection is made, and to remove the slowdown measure for the memory cells with the first assigned programmed data state after the detection is made.

13. The apparatus of claim 12, wherein:

to apply the slowdown measure, the control circuit is configured to apply a positive voltage to bit lines connected to the memory cells with the first assigned programmed data state; and to remove the slowdown measure, the control circuit is configured to apply a ground voltage to the bit lines connected to the memory cells with the first assigned programmed data state.

14. The apparatus of claim 12, wherein:

the control circuit is configured to apply a first set of increasing program voltages to the selected word line of the first block when making the detection and to apply a second set of increasing program voltages to the selected word line of the first block after making the detection; and a first program voltage of the second set of increasing program voltages is lower than a last program voltage of the first set of increasing program voltages.

15. The apparatus of claim 1, wherein:

the control circuit, to detect during the concurrent programming that a defect does not exists in the first block, is configured to determine that a predetermined number of the memory cells in the second block do not pass the first verify test on or before the reference program loop.

* * * * *